US012575443B2

(12) United States Patent
Ishii et al.

(10) Patent No.: US 12,575,443 B2
(45) Date of Patent: Mar. 10, 2026

(54) SEMICONDUCTOR DEVICE AND MANUFACTURING METHOD OF SEMICONDUCTOR DEVICE

(71) Applicants: SONY GROUP CORPORATION, Tokyo (JP); SONY SEMICONDUCTOR SOLUTIONS CORPORATION, Kanagawa (JP)

(72) Inventors: Shigekazu Ishii, Kanagawa (JP); Bernadette Elliott-Bowman, Lausanne (CH); Christopher Wright, London (GB); Timothy Beard, Lausanne (CH); Matthew Lawrenson, Lausanne (CH); Hirotaka Kobayashi, Tokyo (JP); Hiroyuki Shigeta, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 659 days.

(21) Appl. No.: 17/916,131

(22) PCT Filed: Mar. 5, 2021

(86) PCT No.: PCT/JP2021/008625
§ 371 (c)(1),
(2) Date: Sep. 30, 2022

(87) PCT Pub. No.: WO2021/205792
PCT Pub. Date: Oct. 14, 2021

(65) Prior Publication Data
US 2023/0298955 A1 Sep. 21, 2023

(30) Foreign Application Priority Data
Apr. 8, 2020 (JP) .................................. 2020-069848

(51) Int. Cl.
*H01L 23/02* (2006.01)
*H01L 23/31* (2006.01)
*H01L 23/498* (2006.01)

(52) U.S. Cl.
CPC ........ *H01L 23/315* (2013.01); *H01L 23/3142* (2013.01); *H01L 23/49816* (2013.01); *H01L 2924/186* (2013.01)

(58) Field of Classification Search
CPC .............. H01L 23/315; H01L 23/3142; H01L 23/49816; H01L 2924/186; H01L 24/13;
(Continued)

(56) References Cited

U.S. PATENT DOCUMENTS 6,713,857 B1 * 3/2004 Tsai ...................... H01L 21/568
257/E23.19
7,651,891 B1 1/2010 Nguyen
(Continued)

FOREIGN PATENT DOCUMENTS

JP 2009-026791 2/2009
JP 2018-018719 2/2018
(Continued)

OTHER PUBLICATIONS

International Search Report and Written Opinion prepared by the Japan Patent Office on May 28, 2021, for International Application No. PCT/JP2021/008625, 2 pgs.

*Primary Examiner* — Theresa T Doan
(74) *Attorney, Agent, or Firm* — Sheridan Ross PC

(57) ABSTRACT
A region of a sealing part is effectively utilized. A semiconductor device includes a semiconductor element, a substrate, a sealing part, and a cavity region. The substrate included in this semiconductor device is disposed adjacent to a bottom surface of the semiconductor element. The sealing part included in this semiconductor device is formed in a shape
(Continued)

that covers an upper surface that is a surface facing the bottom surface of the semiconductor element, and seals the semiconductor element. The cavity region included in this semiconductor device is a region disposed in the sealing part and formed with a cavity.

23 Claims, 18 Drawing Sheets

(58) Field of Classification Search

CPC ....... H01L 24/29; H01L 24/48; H01L 21/561; H01L 23/04; H01L 2224/05647; H01L 21/56; H01L 23/10; H01L 23/3128; H01L 24/19; H01L 24/96; H01L 25/167; H01L 23/66; H01L 24/16; H01L 24/20; H01L 24/32; H01L 24/73; H01L 23/645; H01L 2224/04042; H01L 2224/1146; H01L 2224/131; H01L 2224/13144; H01L 2224/13147; H01L 2224/16227; H01L 2224/215; H01L 2224/29186; H01L 2224/2919; H01L 2224/32225; H01L 2224/45099; H01L 2224/48091; H01L 2224/48227; H01L 2224/73204; H01L 2224/73265; H01L 2224/92247; H01L 2224/96; H01L 2924/15156; H01L 2924/15311; H01L 2924/171; H01L 25/16; H01L 2924/19041; H01L 2924/19042; H01L 2223/6677; H01L 2224/04105; H01L 2224/12105; H01L 2224/214; H01L 2924/15153; H01L 2924/15313; H01L 2924/16195; H01L 2924/19105; H01F 17/0006; H01F 17/0033; H01F 27/323; H10F 39/804

USPC ......................................................... 257/678

See application file for complete search history.

(56) References Cited

U.S. PATENT DOCUMENTS

| | | | |
|---|---|---|---|
| 2009/0026589 A1 | 1/2009 | Kuramoto | |
| 2015/0348860 A1* | 12/2015 | Park ........................ | H01L 23/13 257/787 |
| 2017/0288111 A1* | 10/2017 | Lee ...................... | H10H 20/819 |

FOREIGN PATENT DOCUMENTS

| | | |
|---|---|---|
| JP | 2019-050267 | 3/2019 |
| WO | WO 2017/028778 | 2/2017 |

* cited by examiner

A

B

SEMICONDUCTOR DEVICE AND MANUFACTURING METHOD OF SEMICONDUCTOR DEVICE

CROSS REFERENCE TO RELATED APPLICATIONS

This application is a national stage application under 35 U.S.C. 371 and claims the benefit of PCT Application No. PCT/JP2021/008625, having an international filing date of 5 Mar. 2021, which designated the United States, which PCT application claimed the benefit of Japanese Patent Application No. 2020-069848, filed 8 Apr. 2020, the entire disclosures of each of which are incorporated herein by reference.

TECHNICAL FIELD

The present disclosure relates to a semiconductor device and a manufacturing method of the semiconductor device. Specifically, the present invention relates to a semiconductor device in which a semiconductor element is sealed and configured in a semiconductor package, and a manufacturing method of the semiconductor device.

BACKGROUND ART

Conventionally, a semiconductor package downsized to the size of a semiconductor chip such as a chip size package (CSP) has been used. For example, a semiconductor chip package has been used in which a protective substrate is bonded to the upper surface of a semiconductor chip with a support part interposed therebetween, and a gap is formed between a functional region formed on the upper surface of the semiconductor chip and the protective substrate before sealing. An image sensor can be disposed in the functional region, and incident light transmitted through the protective substrate including glass or the like can be imaged (see, for example, Patent Document 1).

A hollow cavity is disposed in the support part of the semiconductor chip package described above. The hollow cavity communicates with the gap adjacent to the functional region, and alleviates an increase in internal pressure. In a case where the semiconductor chip package is exposed to a high temperature by a temperature test or the like, water vapor and the like in the gap expands to increase the pressure, which possibly causes breakage to the support part. By arranging the hollow cavity and releasing the pressure of the gap to the hollow cavity, breakage of the support part can be prevented.

CITATION LIST

Patent Document

Patent Document 1: International Publication No. WO 2017/028778

SUMMARY OF THE INVENTION

Problems to be Solved by the Invention

In the above-described conventional technique, there is a problem that a region for sealing a semiconductor chip is not effectively used. In the above-described conventional technique, the hollow cavity is disposed in the support part. Meanwhile, the protective substrate occupying a relatively wide region in the semiconductor package is used only for sealing the upper surface of the semiconductor chip, and there is a problem that the region is not effectively utilized.

The present disclosure has been made in view of the above-described problems, and an object of the present disclosure is to effectively utilize a region of a sealing part.

Solution to Problems

The present disclosure has been made to solve the above-described problems, and a first aspect of the present disclosure is a semiconductor device including: a semiconductor element; a substrate disposed adjacent to a bottom surface of the semiconductor element; a sealing part formed in a shape that covers an upper surface that is a surface opposing to the bottom surface of the semiconductor element, and seals the semiconductor element; and a cavity region that is a region disposed in the sealing part and formed with a cavity.

Furthermore, in the first aspect, in the cavity region, the cavity may include a wall surface that is constituted of the sealing part including resin.

Furthermore, in the first aspect, in the cavity region, the resin that constitutes the wall surface of the cavity may include a photocurable resin.

Furthermore, in the first aspect, in the cavity region, the wall surface of the cavity may be formed by curing the resin that is uncured, and the cavity may be formed by removing the resin that is uncured.

Furthermore, in the first aspect, the cavity region may be constituted by alternately disposing the cavity and the sealing part.

Furthermore, in the first aspect, the cavity region may be constituted by disposing the cavity whose cross-section has a meander structure.

Furthermore, in the first aspect, the cavity region may include the sealing part formed in a lattice shape.

Furthermore, in the first aspect, the cavity region may include the sealing part having the lattice shape of a different thermal expansion coefficient.

Furthermore, in the first aspect, the cavity region may include an element including a conductive member disposed in the cavity.

Furthermore, in the first aspect, the cavity region may include the element including the conductive member disposed in two of the cavities disposed opposed to each other.

Furthermore, in the first aspect, the cavity region may include the element including the conductive member disposed in the cavity having a coil shape.

Furthermore, in the first aspect, the cavity region may include the element including a core part including a magnetic material disposed in the cavity formed in a center part of the cavity having the coil shape.

Furthermore, in the first aspect, the cavity region may include the element including the conductive member disposed in the cavity having a loop shape.

Furthermore, in the first aspect, the semiconductor element may be disposed with a terminal that transmits a signal to the bottom surface, the substrate may include wiring connected to the terminal and extending in a region outside the semiconductor element, and the sealing part may be disposed adjacent to a side surface that is a surface adjacent to the bottom surface of the semiconductor element.

Furthermore, in the first aspect, the sealing part may include a wall part having a shape surrounding the semiconductor element and a lid part having a shape covering an upper surface of the semiconductor element.

Furthermore, in the first aspect, the cavity region may be disposed in the wall part.

Furthermore, in the first aspect, the cavity region may be disposed in the lid part.

Furthermore, in the first aspect, the sealing part may include the lid part that is a transparent member.

Furthermore, in the first aspect, the semiconductor element may include a light receiving element that receives incident light.

Furthermore, in the first aspect, the sealing part may include a lens part including a transparent member and configured to condense the incident light on the light receiving element.

Furthermore, in the first aspect, the semiconductor element may include a light emitting element.

Furthermore, in the first aspect, the sealing part may diffuse light of the light emitting element.

Furthermore, a second aspect of the present disclosure is a manufacturing method of a semiconductor device, the method including: a sealing step of shaping a sealing part that seals a semiconductor element whose bottom surface is disposed adjacent to a substrate into a shape that covers an upper surface opposed to the bottom surface of the semiconductor element; and a cavity region disposing step of disposing a cavity region that is a region in the sealing part where a cavity is formed.

According to the aspect of the present disclosure, there is an effect that the cavity region is disposed in the sealing part having a shape covering the upper surface of the semiconductor element.

MODE FOR CARRYING OUT THE INVENTION

Figure 1:
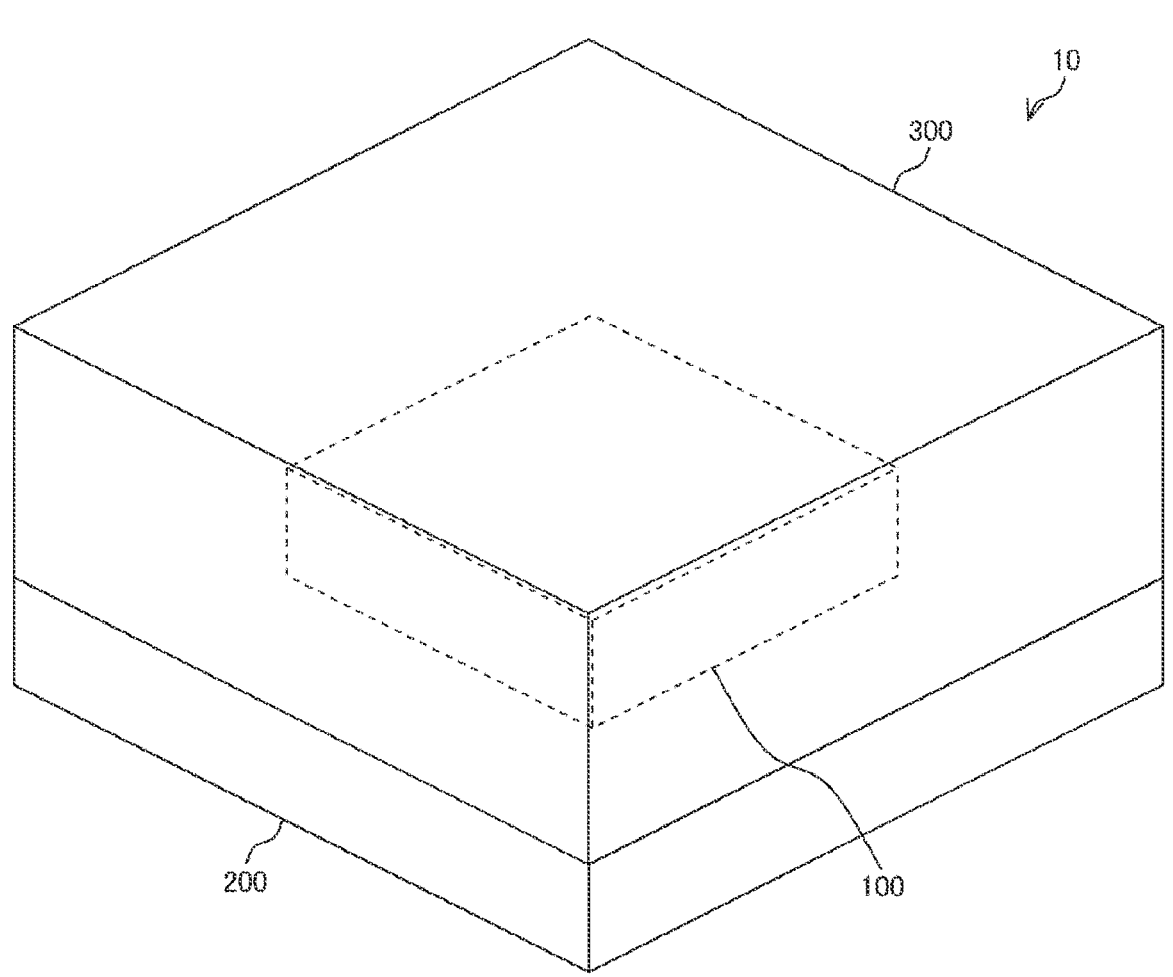
FIG. 1 is a diagram illustrating a configuration example of a semiconductor device according to a first embodiment of the present disclosure.

Next, modes for carrying out the present disclosure (hereinafter, referred to as embodiments) are described with reference to the drawings. In the following drawings, the same or similar portions are denoted by the same or similar reference numerals. Furthermore, the embodiments are described in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment
10. Tenth Embodiment

1. First Embodiment

[Configuration of Semiconductor Device]

FIG. 1 is a diagram illustrating a configuration example of a semiconductor device according to a first embodiment of the present disclosure. The drawing is a diagram illustrating a configuration example of a semiconductor device 10 according to an embodiment of the present disclosure.

The semiconductor device 10 in the drawing is configured such that a semiconductor chip 100 is mounted on a substrate 200, and the periphery of the semiconductor chip 100 is sealed by a sealing part 300.

The semiconductor chip 100 is a semiconductor piece on which an element is formed. This semiconductor chip 100 can be formed, for example, by cutting a wafer of silicon (Si). An electronic circuit including a plurality of elements can be integrated on the semiconductor chip 100.

The substrate 200 is a substrate on which the semiconductor chip 100 is mounted, and is a substrate that supports the semiconductor chip 100. The bottom surface of the semiconductor chip 100 is disposed adjacent to this substrate 200, and a terminal of the semiconductor chip 100 is connected thereto.

The sealing part 300 is provided to seal the semiconductor chip 100. Here, the sealing means covering the periphery of a semiconductor element such as the semiconductor chip 100. This sealing can protect the semiconductor element from the outside air and the like. The sealing part 300 is formed in a shape covering a surface other than the bottom surface of the semiconductor chip 100, and seals the semiconductor chip 100 together with the substrate 200. This sealing part 300 can include resin. As this resin, a photocurable resin is preferably used. This is because a cavity 402 described later can be easily formed.

Furthermore, the sealing part 300 is also disposed in a region adjacent to the substrate 200 outside the semiconductor chip 100. Because this region is not directly involved in the sealing of the semiconductor chip 100, the region can be used for other applications. This is described next.

[Configuration of Sealing Part]

Figure 2:
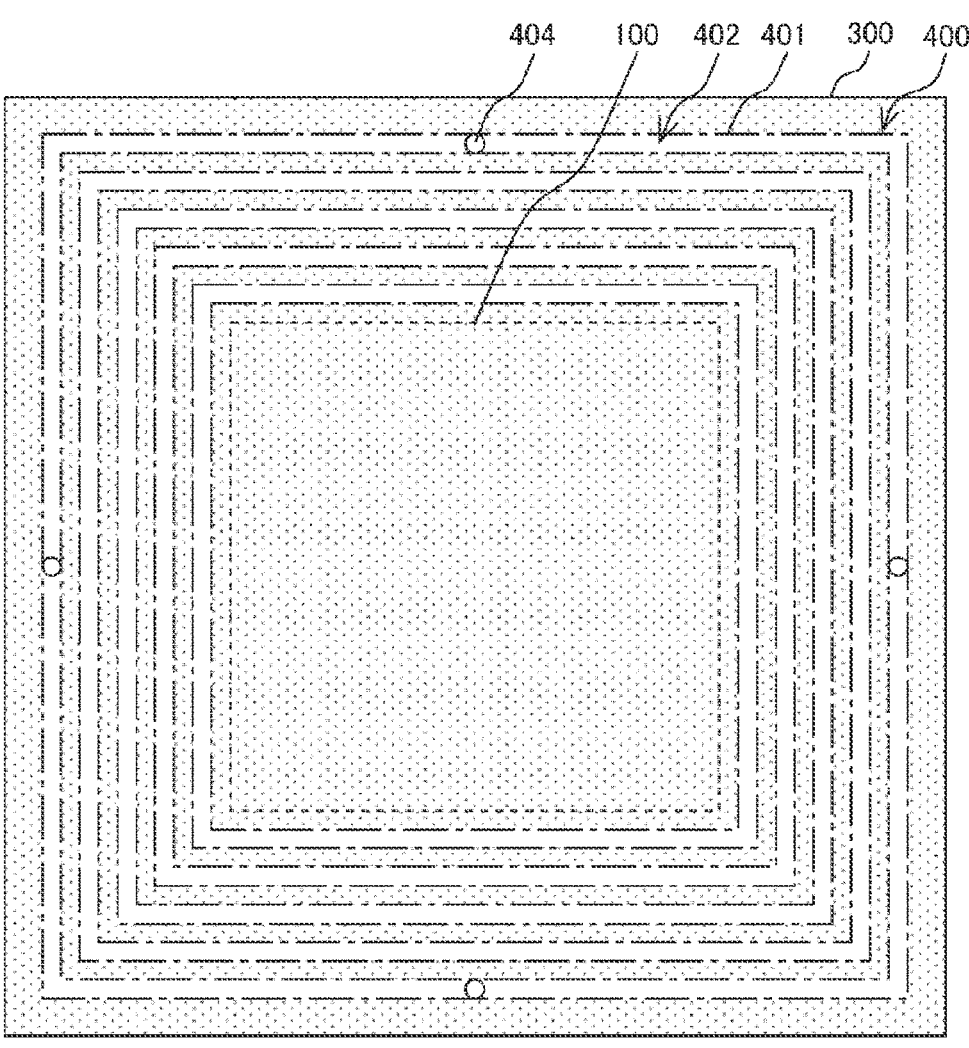
FIG. 2 is a diagram illustrating a configuration example of a sealing part according to the first embodiment of the present disclosure.

FIG. 2 is a diagram illustrating a configuration example of a sealing part according to the first embodiment of the present disclosure. The drawing is a top view of the semiconductor device 10, and is a view illustrating a configuration example of the sealing part 300. A broken-line rectangle in the central part of the drawing represents the semiconductor chip 100. In the sealing part 300 in the drawing, a cavity region 400 is disposed in a region between the semiconductor chip 100 and an end part of the sealing part 300. The cavity region 400 is a region of the sealing part 300 where the cavity is formed. A region surrounded by a one-dot chain line in the drawing represents a cavity 402. For convenience, the region of the sealing part 300 in the drawing is hatched to be distinguished from the cavity 402. The cavity 402 in the drawing is a region divided by a wall surface 401 of the sealing part 300. The cavity region 400 in the drawing represents an example in which a plurality of the cavities 402 is disposed in layers. As described later, the plurality of cavities 402 in the drawing is connected in a region (not illustrated), and is configured as a single cavity.

This cavity 402 can be formed at the time of forming the sealing part 300 using a photocurable resin. Specifically, an uncured resin is disposed in the periphery of the semiconductor chip 100, and the resin in a region other than a region where the cavity 402 is formed is cured. As a result, the sealing part 300 is formed and the wall surface 401 of the cavity 402 is formed. Thereafter, the uncured resin is removed to form the cavity 402. The uncured resin can be removed by discharging the uncured resin from the surface of the sealing part 300 through a hole 404 formed in the wall surface 401 of the cavity 402.

[Configuration of Cross-Section of Semiconductor Device]

Figure 3:
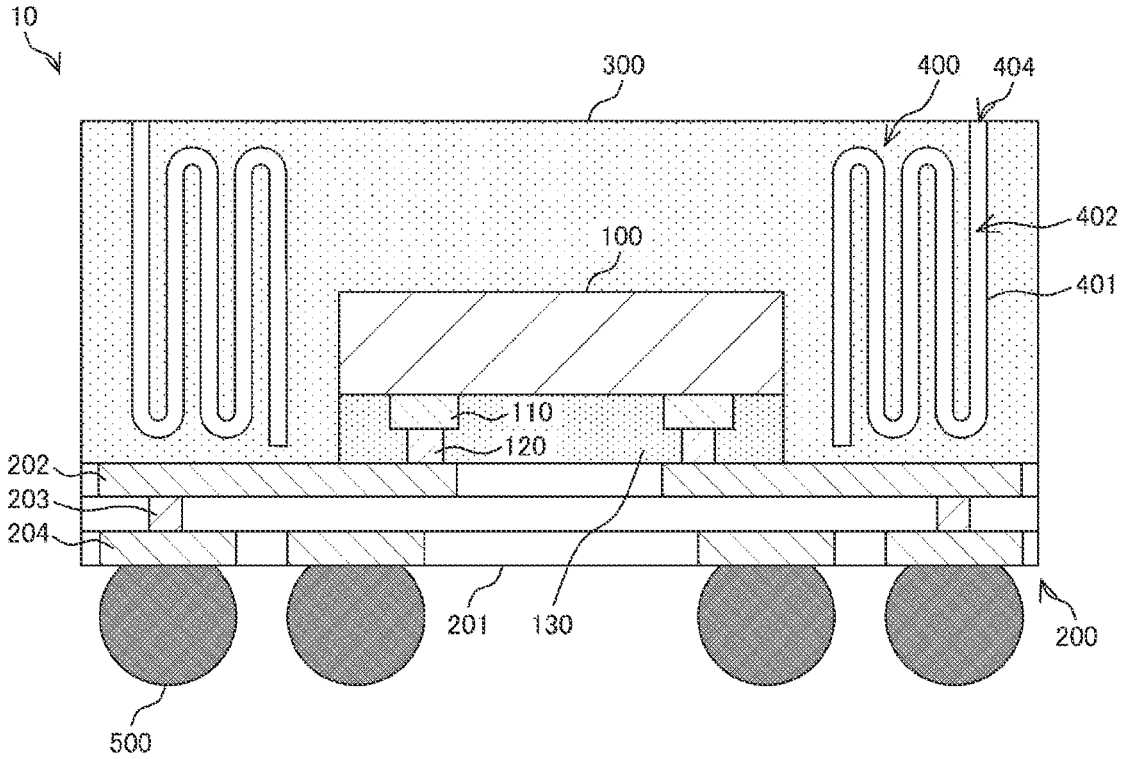
FIG. 3 is a diagram illustrating a configuration example of the semiconductor device according to the first embodiment of the present disclosure.

FIG. 3 is a diagram illustrating a configuration example of the semiconductor device according to the first embodiment of the present disclosure. The drawing is a cross-sectional view representing a configuration example of the semiconductor device 10. The semiconductor device 10 includes the semiconductor chip 100, the substrate 200, the sealing part 300, the cavity region 400, and a connecting part 500.

As described above, the semiconductor chip 100 is a semiconductor piece on which an element is formed. On the bottom surface of this semiconductor chip 100, the bottom surface being a surface opposing to the upper surface thereof, a pad 110, a bump 120, and an insulating film 130 are disposed.

The pad 110 is an electrode disposed on the bottom surface of the semiconductor chip 100. To this pad 110, a signal of the element is transmitted by wiring formed inside the semiconductor chip 110. A plurality of such pads 110 is disposed on the bottom surface of the semiconductor chip 100 to constitute an input/output terminal of the semiconductor chip 100. The pad 110 can include metal such as copper (Cu).

The bump 120 is a columnar protrusion disposed on the pad 110. The pad 110 and a wiring layer 202 of the substrate 200 described later are connected via this bump 120. This bump 120 can include metal such as Cu and gold (Au). Furthermore, the bump 120 can also be formed by soldering. Furthermore, the bump 120 can be formed by, for example, plating or the like.

The insulating film 130 insulates the bottom surface of the semiconductor chip 100. This insulating film 130 is formed in a shape that covers the side surface of the pad 110, and protects the bottom surface of the semiconductor chip 100 and the pad 110. The insulating film 130 in the drawing is formed in a shape that covers the side surface of the bump 120, and further protects the bump 120. This insulating film 130 can include, for example, resin such as solder resist, for example. Furthermore, the insulating film 130 can also include inorganic material such as silicon oxide ($SiO_2$) or silicon nitride (SiN).

As described above, the substrate 200 is a substrate on the surface of which the semiconductor chip 100 is mounted. This substrate 200 includes the wiring layer 202 and an insulating layer 201. The wiring layer 202 is wiring that transmits a signal of the semiconductor chip 100. The wiring layer 202 in the drawing is connected to the pad 110 via the bump 120 of the semiconductor chip 100 and is formed in a shape extending in a region outside the semiconductor chip 100. This wiring layer 202 can include, for example, metal such as Cu, Au, nickel (Ni), chromium (Cr), or palladium (Pd). The insulating layer 201 insulates the wiring layer 202. This insulating layer 201 can include, for example, an epoxy resin, a polyimide resin, an acrylic resin, a phenol resin, or the like. The wiring layer 202 and the insulating layer 201 can be configured in multiple layers. The wiring layers 202 disposed in different layers are connected by a via 203. This via 203 can include metal or the like having a columnar shape.

Note that on the back surface of the substrate 200, a substrate pad 204 is disposed. This substrate pad 204 is connected to the pad 110 of the semiconductor chip 100 via the wiring layer 202 and the via 203. Further, the connecting part 500 described later is joined to the substrate pad 204. By the substrate 200 having the wiring layer 202, the pad 110 of the semiconductor chip 100 is re-disposed on the substrate pad 204 in a region outside the semiconductor chip 100. Such a substrate 200 is referred to as a fan-out substrate. Furthermore, a semiconductor package configured to have substantially the same size as the semiconductor chip 100 using a fan-out substrate is referred to as a fan-out wafer level package (FOWLP).

The connecting part 500 is a terminal that is disposed on the substrate pad 204 and connects the semiconductor device 10 to a substrate of another electronic device. This connecting part 500 can include metal such as solder ball.

As described above, the sealing part 300 is provided to seal the semiconductor chip 100. In the sealing part 300 in the drawing, the cavity region 400 is disposed in a region outside a region where the semiconductor chip 100 is disposed. The cavity 402 described above is disposed in this cavity region 400. As illustrated in the drawing, the cavity 402 is configured to have a meander structure in which a single cavity is folded a plurality of times, and is configured to have a plurality of layers except for the folded portion. The hole 404 is formed in the wall surface 401 of the cavity 402.

By disposing such a cavity 402, the influence of strain and stress can be reduced, which is generated based on the difference in thermal expansion coefficients between those of the semiconductor chip 100 and the sealing part 300. Because the semiconductor chip 100 including Si, and the substrate 200 and the sealing part 300 including resin or the like have different thermal expansion coefficients, different types of strain are generated when the temperature changes. For this reason, the stress is generated at the interface where these components are in contact with each other. Excessive stress applied to the interface causes breakage. For example, the breakage such as peeling possibly occurs at the interface between the semiconductor chip 100 and the sealing part 300. The reliability of the semiconductor package is reduced. Therefore, the cavity region 400 is disposed to absorb stress. The stress is relaxed, and the influence of the strain and stress can be reduced.

[Another Configuration of Semiconductor Device]

Figure 4:
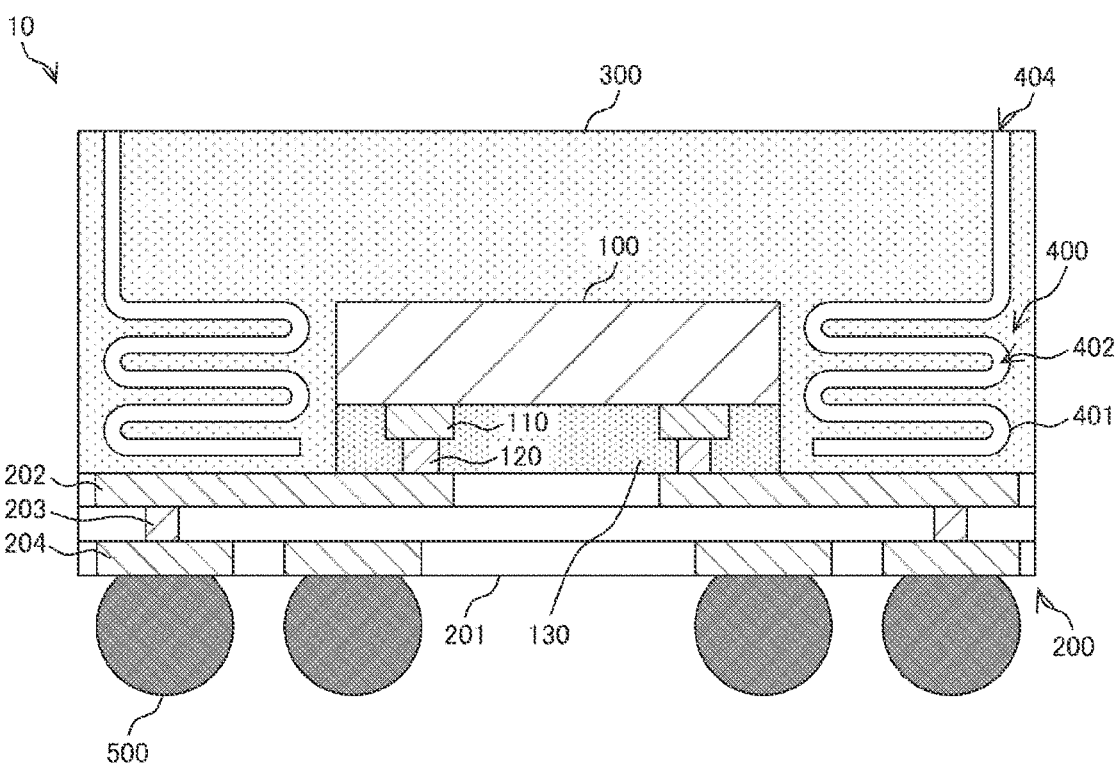
FIG. 4 is a diagram illustrating another configuration example of the semiconductor device according to the first embodiment of the present disclosure.

FIG. 4 is a diagram illustrating another configuration example of the semiconductor device according to the first embodiment of the present disclosure. Similarly to FIG. 3, the drawing is a cross-sectional view representing a configuration example of the semiconductor device 10. This configuration differs from that of the cavity 402 in FIG. 3 in that the cavity 402 of the cavity region 400 is formed in a shape of a horizontal layer. The cavity 402 in the drawing can also be formed by a manufacturing method similar to that of the cavity 402 in FIG. 3.

[Manufacturing Method of Semiconductor Device]

Figure 5:
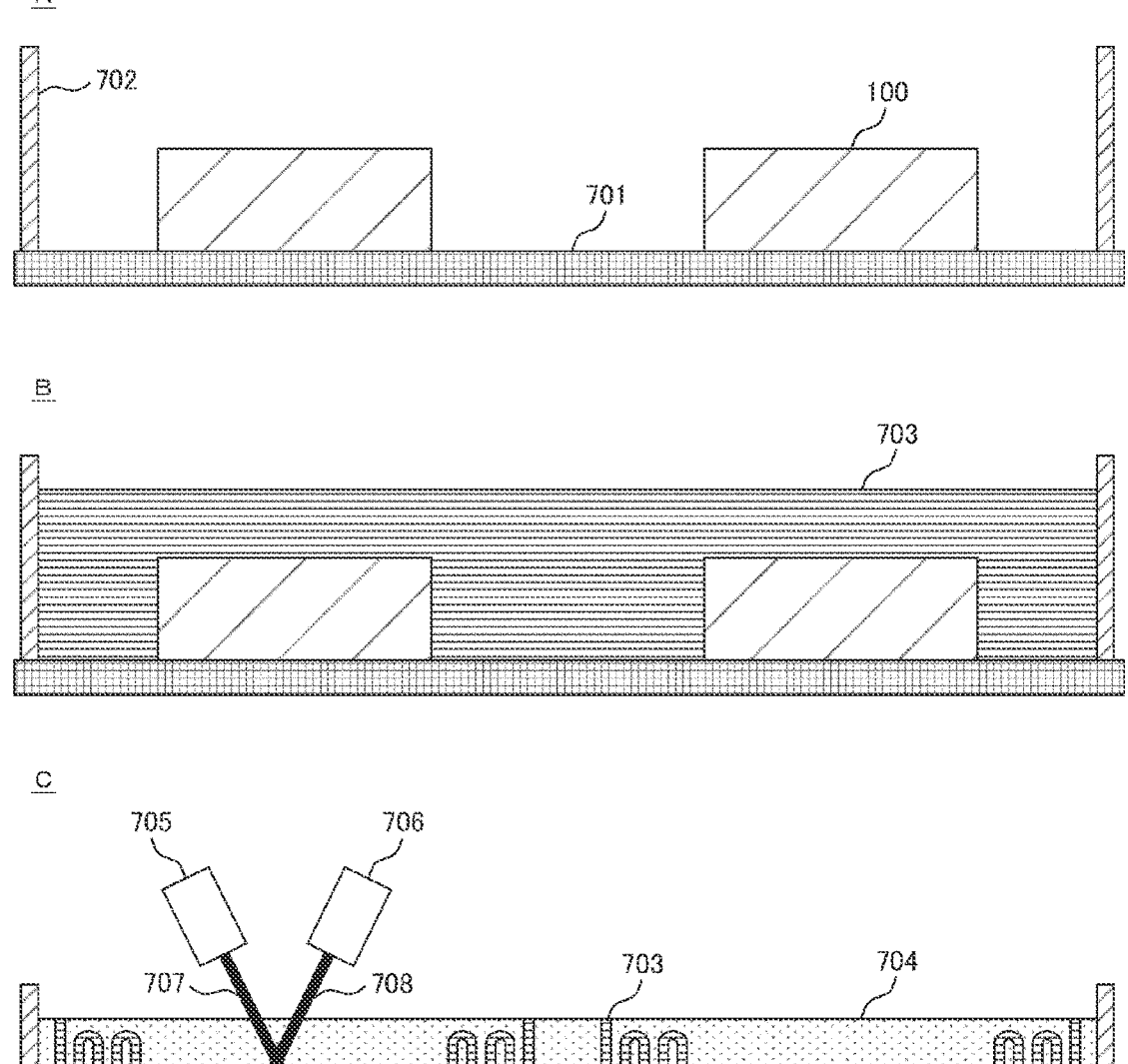
FIG. 5 is a diagram illustrating an example of a manufacturing method of the semiconductor device according to the first embodiment of the present disclosure.
Figure 6:
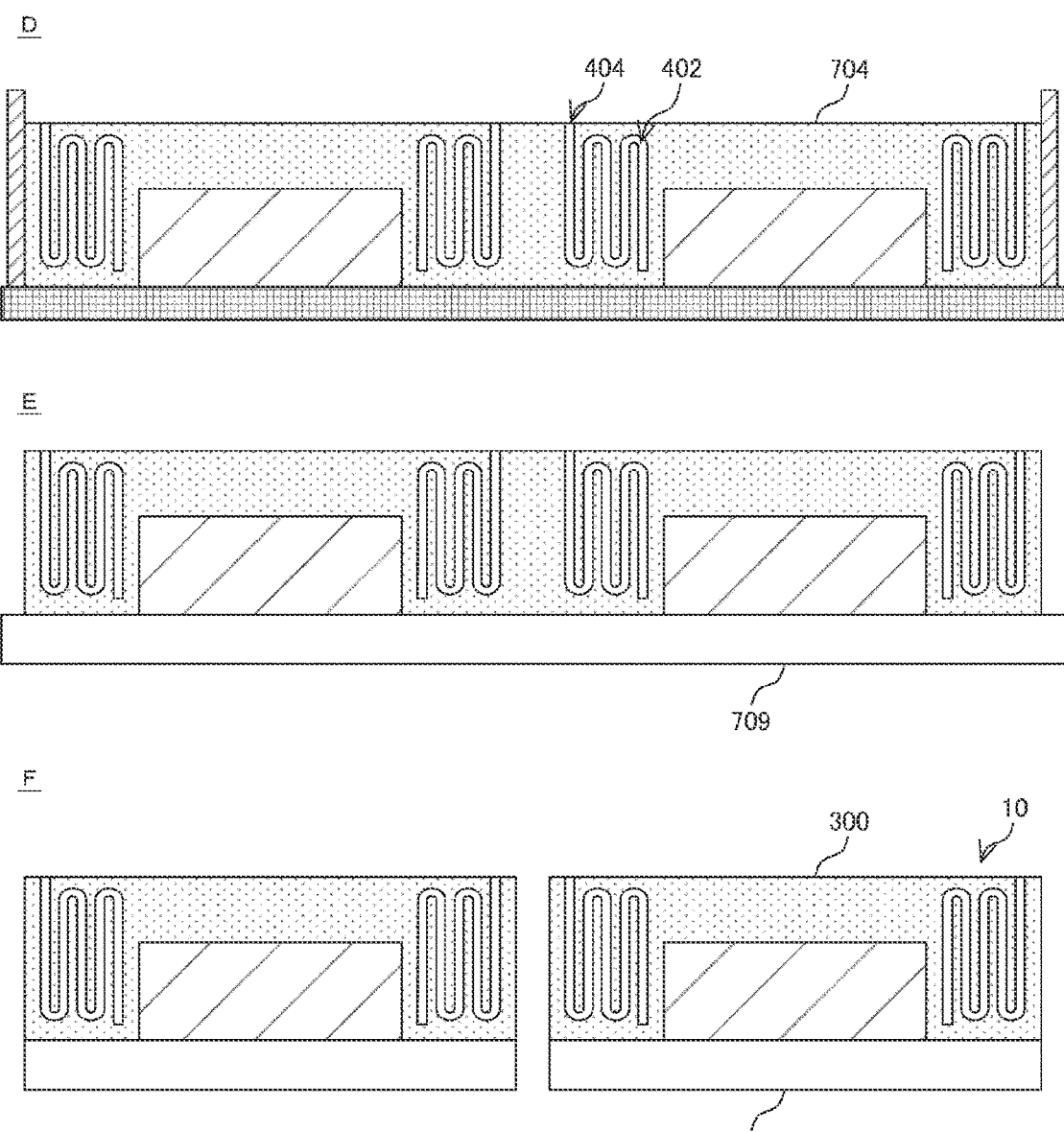
FIG. 6 is a diagram illustrating an example of the manufacturing method of the semiconductor device according to the first embodiment of the present disclosure.

FIGS. 5 and 6 are diagrams each illustrating an example of a manufacturing method of the semiconductor device according to the first embodiment of the present disclosure. FIGS. 5 and 6 are diagrams each representing an example of a manufacturing process of the semiconductor chip 100.

First, the semiconductor chip 100 is disposed on a support substrate 701. This support substrate 701 is a substrate that supports the semiconductor chip 100 at the time of manufacturing the semiconductor device 10. A plurality of the semiconductor chips 100 can be disposed on the support substrate 701. The drawing represents an example in which two pieces of the semiconductor chips 100 are disposed. Next, the frame body 702 is disposed around the semiconductor chip 100. This frame body 702 is a frame that holds the resin of the sealing part 300 (A in FIG. 5).

Next, a liquid resin 703 to be material of the sealing part 300 is disposed in the frame body 702. This resin 703 is injected to allow the semiconductor chip 100 to be immersed therein (B in FIG. 5).

Next, the resin 703 is cured. This curing of the resin 703 can be performed by a plurality of laser beam sources. This drawing represents an example of a case where two laser beam sources 705 and 706 are used. As represented in C of FIG. 5, laser beams 707 and 708 are respectively emitted from the laser beam sources 705 and 706. The laser beams 707 and 708 are adjusted to have energy lower than the curing energy of the resin 703 and are also adjusted to have energy higher than the curing energy of the resin 703 at the intersection of the laser beams 707 and 708. As a result, only the resin 703 at the intersection of the laser beams 707 and 708 can be cured. The laser beams 707 and 708 are scanned using a galvano scanner or the like to form a resin 704 This resin 704 is obtained by curing the resin 703. Such a manufacturing method is referred to as a continuous liquid interface production (CLIP). On the other hand, the resin 703 is held in an uncured state in a region where the cavity 402 is disposed (C in FIG. 5). This step corresponds to a sealing step.

Next, the uncured resin 703 is removed. This can be performed by discharging the resin 703 from the hole 404. Specifically, the resin 703 is sucked in any one of a plurality of the holes 404, and the other holes 404 are used as air holes. Thereafter, the resin 703 can be removed by performing cleaning. As a result, the cavity 402 can be formed (D in FIG. 6). This step corresponds to a cavity region disposing step.

Next, the frame body 702 and the support substrate 701 are removed, and a substrate 709 is disposed. The substrate 709 is a substrate having a configuration in which a plurality of the substrates 200 is coupled to each other. The substrate 709 can be disposed, for example, by laminating the insulating layer 201 and the wiring layer 202 on the bottom surface of the semiconductor chip 100 (E in FIG. 6).

Next, the semiconductor chips 100 are separated into individual pieces. The resin 704 and the substrate 709 are cut to form the sealing part 300 and the substrate 200. As a result, the semiconductor device 10 can be manufactured (F in FIG. 6).

As described above, the semiconductor device 10 according to the first embodiment of the present disclosure can effectively utilize the region of the sealing part 300 by disposing the cavity region 400 that reduces the stress in the sealing part 300.

2. Second Embodiment

In the semiconductor device 10 of the above-described first embodiment, the cavity region 400 including the cavity 402 configured in layers is disposed. On the other hand, a semiconductor device 10 according to a second embodiment of the present disclosure is different from the above-described first embodiment in including a cavity region in which a cavity is formed by using a resin having a lattice shape.

[Configuration of Semiconductor Device]

Figure 7:
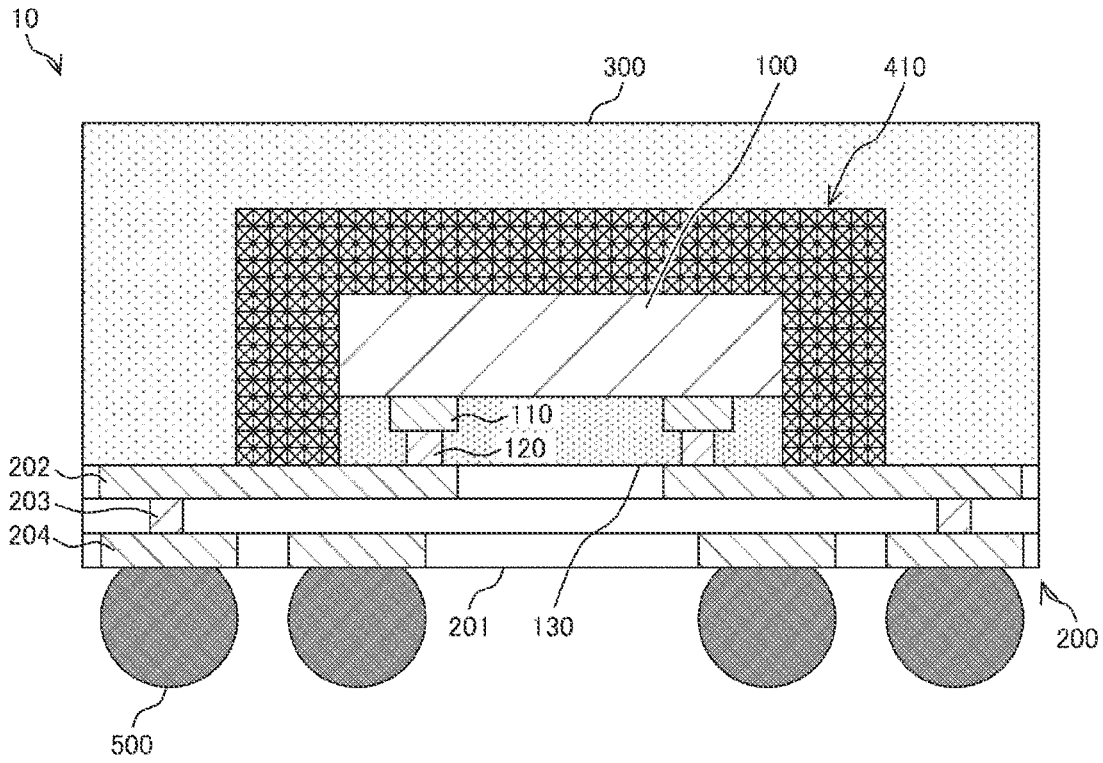
FIG. 7 is a diagram illustrating a configuration example of a semiconductor device according to a second embodiment of the present disclosure.

FIG. 7 is a diagram illustrating a configuration example of the semiconductor device according to the second embodiment of the present disclosure. Similarly to FIG. 3, the drawing is a cross-sectional view representing a configuration example of the semiconductor device 10. The semiconductor device is different from the semiconductor device 10 described in FIG. 3 in that a cavity region 410 is disposed instead of the cavity region 400.

The cavity region 410 includes a sealing part 300 formed in a lattice shape. A gap of this lattice constitutes a cavity in the cavity region 400. The cavity region 410 in the drawing can be disposed in a region between the semiconductor chip 100 and the sealing part 300.

[Configuration of Cavity Region]

Figure 8:
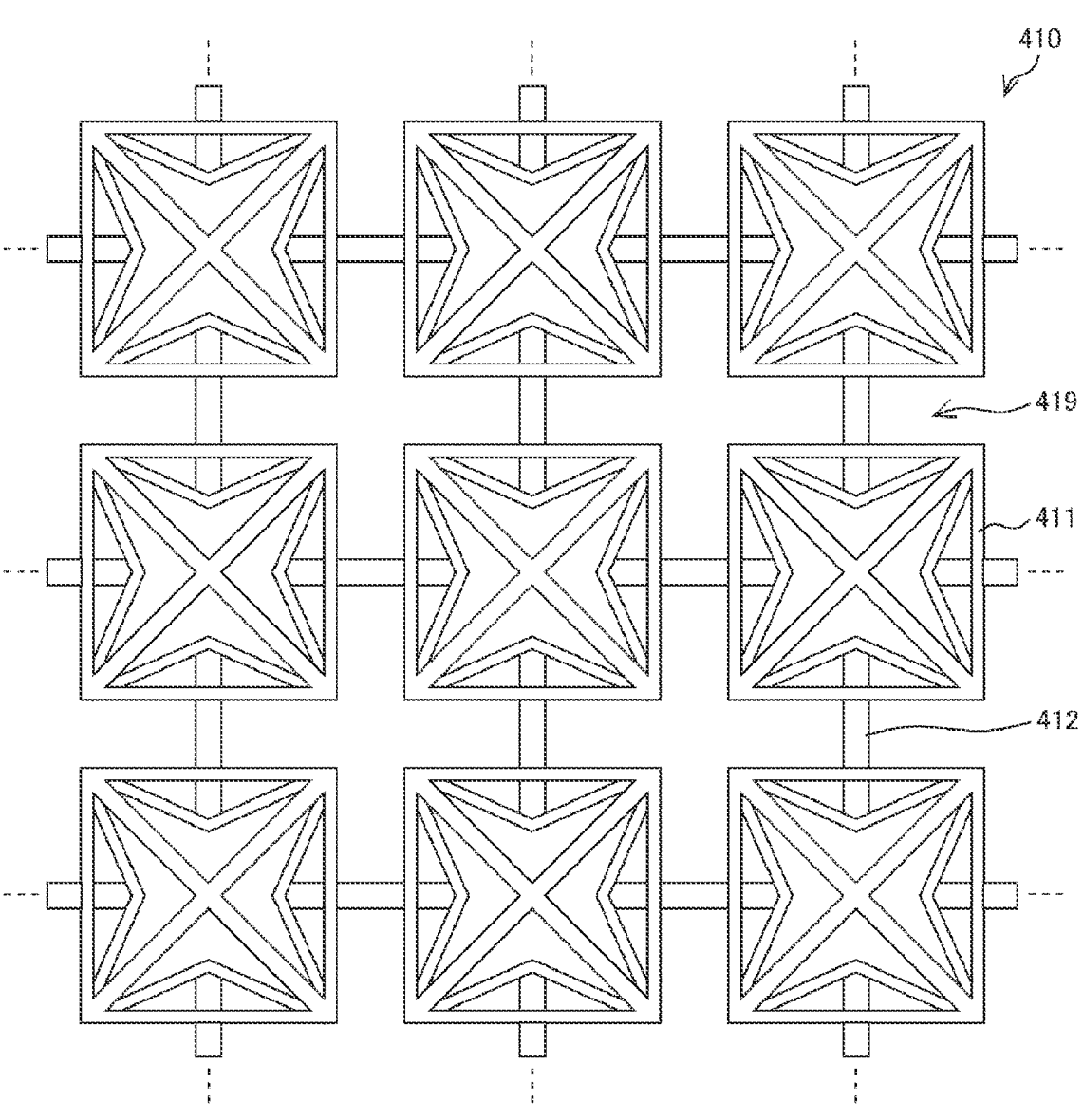
FIG. 8 is a diagram illustrating a configuration example of a cavity region according to the second embodiment of the present disclosure.

FIG. 8 is a diagram illustrating a configuration example of a cavity region according to the second embodiment of the present disclosure. The drawing is a diagram representing a configuration example of the cavity region 410. The cavity region 410 includes a unit lattice 411, a coupling part 412, and a cavity 419.

The unit lattice 411 is a structure having a lattice shape and formed by joining a plurality of beams in a cubic shape. The unit lattices 411 are arranged in a three-dimensional lattice shape to form the cavity region 410. A detailed configuration of the unit lattice 411 is described later.

The coupling part 412 couples adjacent unit lattices 411 to each other among the plurality of unit lattices 411. The unit lattices 411 are coupled together by this coupling part 412, and the plurality of unit lattices 411 is arranged in a three-dimensional lattice shape.

In the drawing, for convenience, nine pieces of the unit lattices 411 arranged two-dimensionally are illustrated, but the number of unit lattices 411 is not limited, and the plurality of unit lattices 411 is further arranged in the depth direction of the paper surface of the drawing to form the three-dimensional shape.

[Configuration of Unit Lattice]

Figure 9:
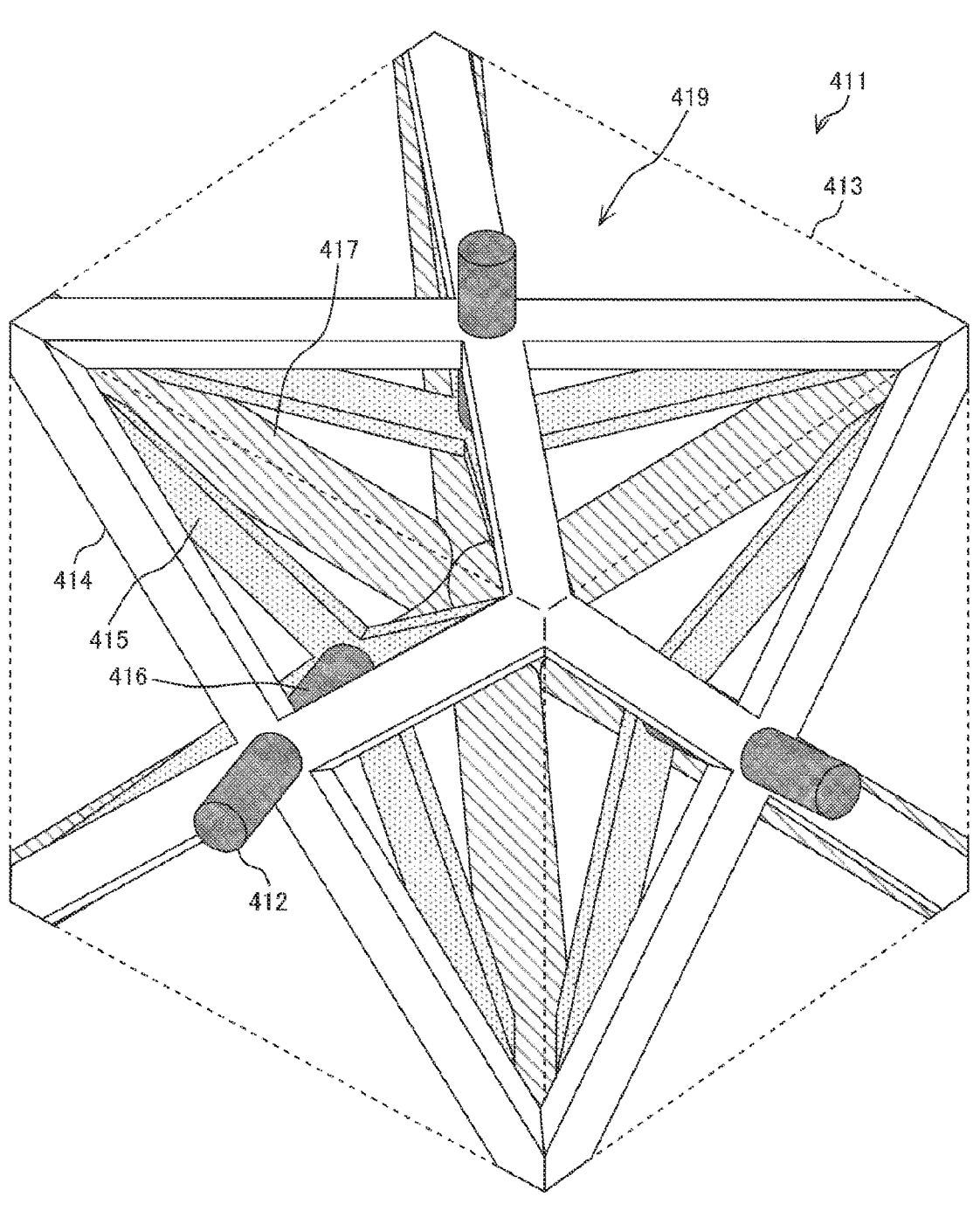
FIG. 9 is a diagram illustrating a configuration example of a unit lattice according to the embodiment of the present disclosure.

FIG. 9 is a diagram illustrating a configuration example of the unit lattice according to the embodiment of the present disclosure. The drawing is a diagram representing a configuration example of the unit lattice 411. The unit lattice 411 in the drawing includes a beam 414, a flexible member 415, a reinforcing member 417, and a flexible member coupling part 416. Note that, in the unit lattice 411 in the drawing, the coupling part 412 is also illustrated. For convenience, the beam 414, the flexible member 415, the reinforcing member 417, and the flexible member coupling part 416 are distinguished by different types of hatching. A cube 413 indicated by a broken line in the drawing is an auxiliary line representing the outer shape of the unit lattice 411, and does not constitute the unit lattice 411.

The beam 414 is formed in a rod shape and joined in a cubic shape. A plurality of the beams 414 is joined to each other to form the outer shape of the unit lattice 411. This beam 414 represents an example of being disposed between opposing vertices on each surface of the cube 413. Furthermore, the beams 414 are formed in a diagonal shape by making the two beams 414 intersect on each surface of the cube 413. The beam 414 can include, for example, resin.

The flexible member 415 causes the beam 414 to bend inward of the cube 413. This flexible member 415 is formed in a rod shape bulging inward of the cube 413, is disposed inside the cube 413 of the beam 414, and has ends joined to the vicinities of both ends of the beam 414. The flexible member 415 can be disposed on each of the plurality of beams 414. Furthermore, similarly to the beam 414, the flexible member 415 can be formed in a shape in which the two flexible members 415 intersect on each surface of the cube 413. The flexible member 415 can include a member having a higher thermal expansion coefficient than the beam 414, for example, a resin having a higher thermal expansion coefficient than the member constituting the beam 414. In this case, the flexible member 415 extends longer than the beam 414 when the temperature rises. As a result, the flexible member 415 is deformed into a shape that bends inward of the cube 413 as the temperature rises.

The flexible member coupling part 416 is configured in a rod shape to couple the beam 414 and the flexible member 415 to each other. The flexible member coupling part 416 is joined to a central part of the beam 414 and a central part of the flexible member 415 to couple the beam 414 and the flexible member 415 to each other. The flexible member coupling part 416 in the drawing is disposed on each surface of the cube 413. By disposing the flexible member coupling part 416, the beam 414 can be bent inward of the cube 413 when the flexible member 415 is bent as the temperature rises.

The reinforcing member 417 reinforces the plurality of beams 414 joined to each other. This reinforcing member 417 is disposed between opposing two vertices via the center of the cube 413, and is joined to the beam 414 at the two vertices. The drawing represents an example in which the four reinforcing members 417 are formed in a shape that intersect at the central part of the cube 413.

Note that the coupling part 412 can be disposed on a side of the beam 414 different from the side on which the flexible member coupling part 416 is disposed.

The beam 414, the flexible member 415, the flexible member coupling part 416, the reinforcing member 417, and the coupling part 412 can include the photocurable resin described above, and can be formed by the CLIP manufacturing method.

By configuring the cavity region 410 with the plurality of unit lattices 411 coupled by the coupling parts 412, flexibility can be imparted to the cavity region 410. Therefore, even in a case where the strain is generated in the semiconductor device 10 with an increase in temperature due to the difference or the like in thermal expansion coefficients between the semiconductor chip 100 and the substrate 200 and stress is applied to the cavity region 410, the stress can be dispersed and reduced. The breakage at the interface between the semiconductor chip 100 and the sealing part 300 can be prevented.

[Contraction of Terminal]

Figure 10:
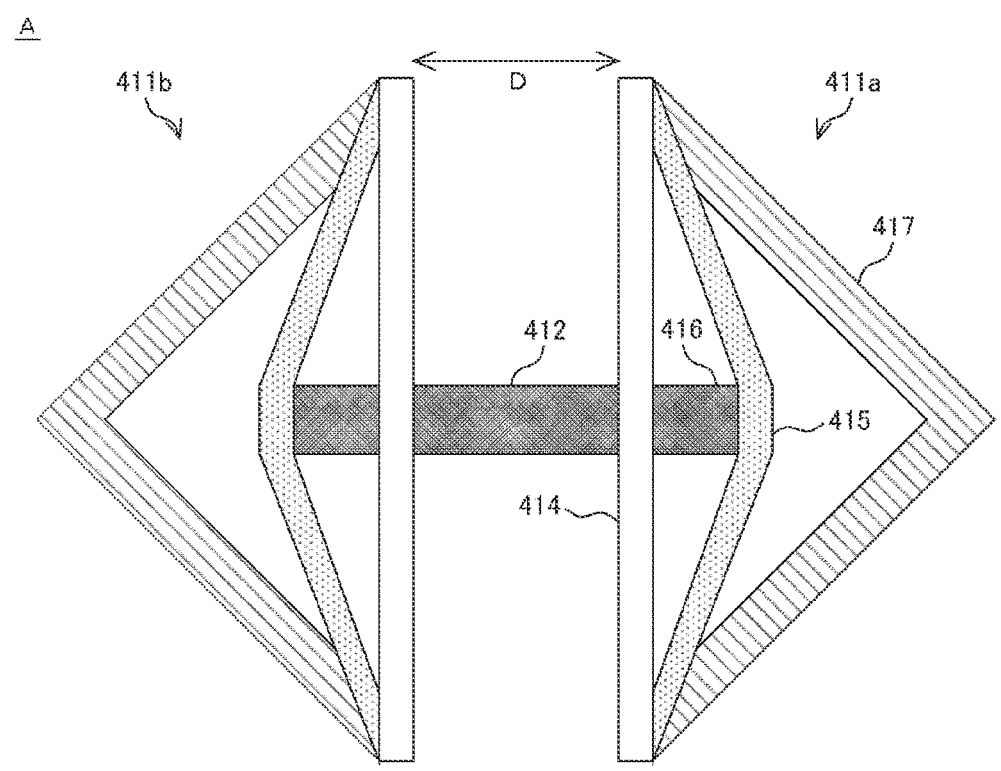
FIG. 10 is a diagram illustrating an example of contraction of a cavity region 410 according to the embodiment of the present disclosure.
Figure 10:
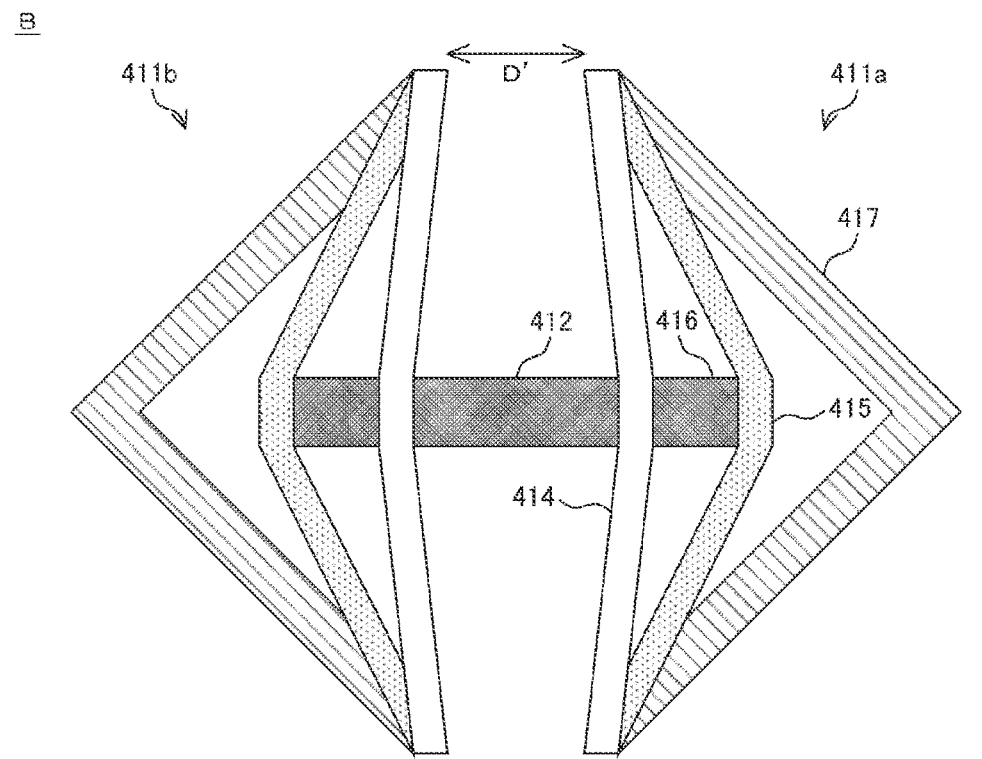

FIG. 10 is a diagram illustrating an example of contraction of the cavity region 410 according to the embodiment of the present disclosure. The drawing is a diagram illustrating the behavior of the coupled unit lattices 411 when the temperature of the cavity region 410 rises. Furthermore, the drawing is a diagram representing a set of the beam 414, the flexible member 415, the flexible member coupling part 416, and the reinforcing member 417 of each of unit lattices 411a and 411b coupled by the coupling part 412.

A of the drawing is a view representing states of the unit lattices 411a and 411b before the temperature rises. "D" in A of the drawing is a view representing an interval between the unit lattices 411a and 411b before the temperature rises.

B of the drawing is a view representing states of the unit lattices 411a and 411b after the temperature rises. As the temperature rises, the flexible member 415 extends. As described above, the flexible member 415 is formed in a shape in which both ends are joined to the beam 414 and the reinforcing member 417 and a central part bulges inward of the cube 413. Therefore, when the temperature rises, the flexible member 415 extends and the central part bends inward of the cube 413. As a result, the beam 414 coupled to the flexible member 415 by the flexible member coupling part 416 is drawn inward of the cube 413 and bent. In a case where the bent amount of this beam 414 is larger than the extended amount of the coupling part 412, the unit lattices 411a and 411b approach each other. "D'" in B of the drawing represents an interval between the unit lattices 411a and 411b after the temperature rises, and is narrower than "D" in A of the drawing. Note that, for convenience, in B of the drawing, description of extension of members other than the flexible member 415 accompanying the temperature rise is omitted.

As described above, by making the thermal expansion coefficient of the flexible member 415 larger than that of the beam 414, the thermal expansion coefficient of the cavity region 410 can be set to a negative value. In this case, expansion, contraction, and the like of the semiconductor chip 100 and the sealing part 300 due to the temperature change can be absorbed by the cavity region 410. A change in the overall volume of the semiconductor device 10 can be reduced. The breakage or the like of a joint portion between the connecting part 500 of the semiconductor device 10 mounted on an external substrate or the like and the external substrate.

[Another Configuration of Cavity Region]

Figure 11:
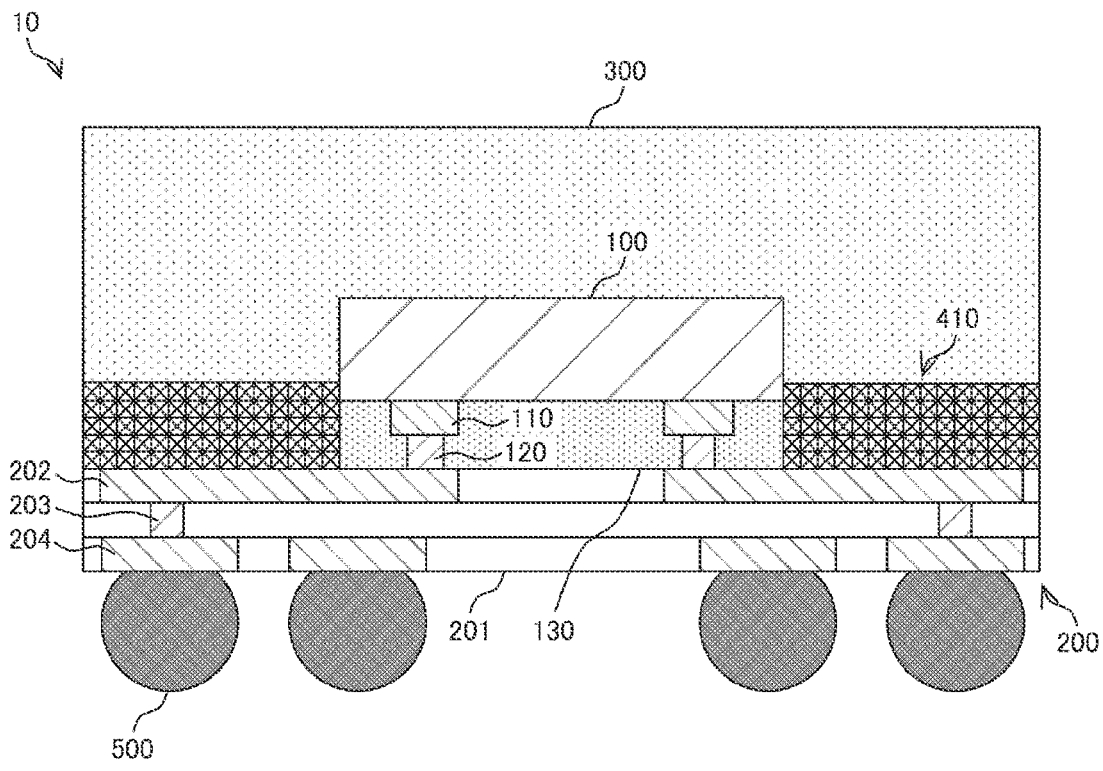
FIG. 11 is a diagram illustrating another configuration example of a cavity region according to the second embodiment of the present disclosure.

FIG. 11 is a diagram illustrating another configuration example of the cavity region according to the second embodiment of the present disclosure. Similarly to FIG. 7, the drawing is a cross-sectional view representing a configuration example of the semiconductor device 10. The semiconductor device is different from the semiconductor device 10 in FIG. 7 in that the cavity region 410 is disposed between the sealing part 300 and the substrate 200.

The cavity region 410 in the drawing is disposed between the sealing part 300 and the substrate 200, and can prevent breakage of the interface between the sealing part 300 and the substrate 200.

Because the configuration of the semiconductor device 10 other than the above is similar to the configuration of the semiconductor device 10 described in the first embodiment of the present disclosure, the description thereof is omitted.

As described above, the semiconductor device 10 according to the second embodiment of the present disclosure can effectively utilize the region of the sealing part 300 by the cavity region 410 in which the cavity 419 is formed using the resin formed in a lattice shape.

3. Third Embodiment

In the semiconductor device 10 of the above-described first embodiment, the cavity 402 is disposed in the cavity region 400. On the other hand, a semiconductor device 10 according to a third embodiment of the present disclosure is different from the above-described first embodiment in that an element is disposed in a cavity region.

[Configuration of Cavity Region]

Figure 12:
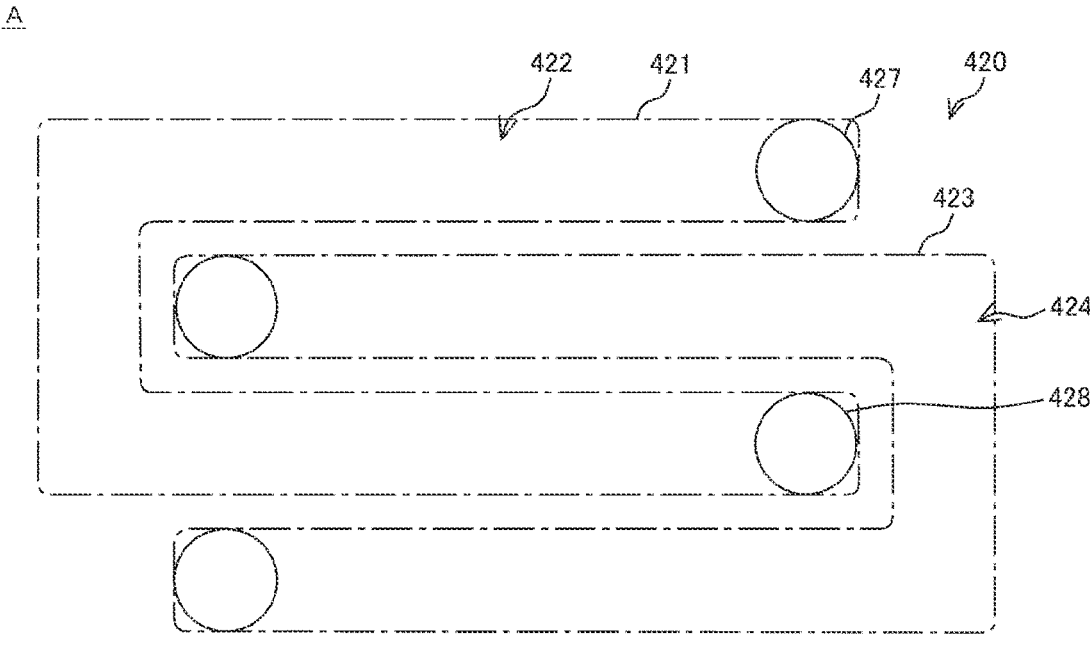
FIG. 12 is a diagram illustrating a configuration example of a cavity region according to a third embodiment of the present disclosure.
Figure 12:
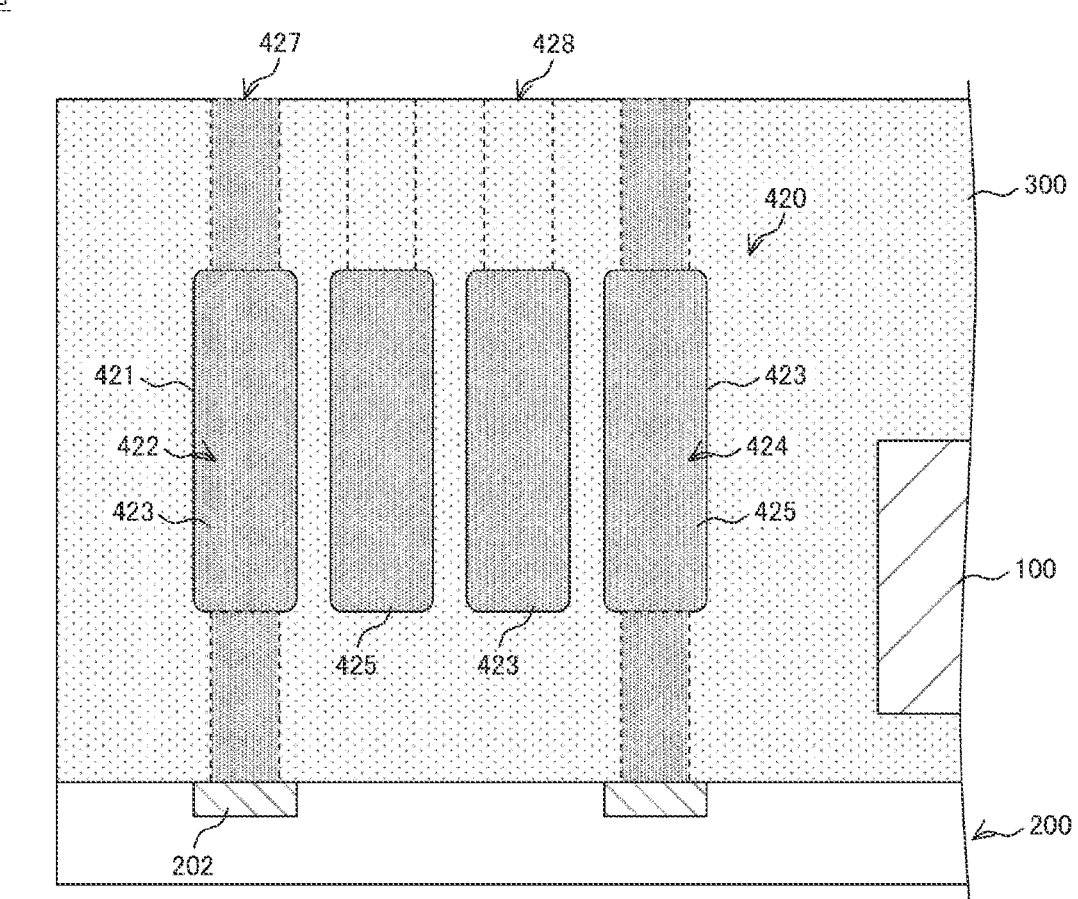

FIG. 12 is a diagram illustrating a configuration example of a cavity region according to the third embodiment of the present disclosure. The drawing is a diagram representing a configuration example of a cavity region 420. The cavity region 420 in the drawing is different from the cavity region 400 described in FIG. 3 in that two cavities 422 and 424 are disposed and a conductive member is disposed in each of these cavities.

A in the drawing is a diagram representing a configuration example of the cavity region 420. The cavities 422 and 424 are disposed in the cavity region 420. The cavity 422 is a region divided by a wall surface 421 and is formed in a U shape. Furthermore, the cavity 422 has holes 427 and 428 disposed therein. The cavity 424 is a region divided by a wall surface 423, formed in a U shape similarly to the cavity 422, and having holes disposed therein. The U-shaped end parts of the cavities 422 and 424 are respectively arranged at adjacent positions. As described later, the conductive member is disposed in the cavities 422 and 424.

B in the drawing is a cross-sectional view representing a configuration example of the cavity region 420. B of the drawing is a view of the cavity region 420 of the semiconductor device 10 represented in an enlarged manner. Note that, in B of the drawing, a semiconductor chip 100 and a substrate 200 are illustrated in a simple manner.

In the cavities 422 and 424, conductive members 423 and 425 are respectively disposed and configured into electrodes. The electrodes of the conductive members 423 and 425 are alternately arranged to constitute a capacitor element. The hole 427 is formed in a shape penetrating the sealing part 300, and has a bottom part disposed at a position adjacent to a wiring layer 202 of the substrate 200. The conductive member 423 can include, for example, a thermosetting resin in which Cu or Ag particles are dispersed. By injecting the conductive member 423 including an uncured resin from the hole 427 into the cavity 422 and curing the same, the conductive member 423 can be disposed. Specifically, the conductive member can be injected using a jet dispenser that performs dispensing with high pressure. Note that, at the time of injecting the conductive member 423, air in the cavity can be discharged at the same time through the hole 428. Thereafter, the resin constituting the uncured conductive member 423 is heated and cured to form the electrode-like conductive member 423. Furthermore, the conductive member 423 is connected to the wiring layer 202 by the conductive member arranged in the hole 427. The conductive member 425 can also be formed in the similar manner as the conductive member 423, and can be connected to the wiring layer 202.

Note that the configurations of the conductive members 423 and 425 are not limited to this example. For example, the conductive members 423 and 425 can be formed in a shape having three or more end parts.

Because the configuration of the semiconductor device 10 other than the above is similar to the configuration of the semiconductor device 10 described in the first embodiment of the present disclosure, the description thereof is omitted.

As described above, the semiconductor device 10 according to the third embodiment of the present disclosure can effectively utilize the region of the sealing part 300 by disposing, in the sealing part 300, the cavity region 420 having the conductive members 423 and 425 that constitute the capacitor element.

4. Fourth Embodiment

In the semiconductor device 10 of the above-described third embodiment, the cavity region 420 having the capacitor element is disposed. On the other hand, a semiconductor device 10 according to a fourth embodiment of the present disclosure is different from the above-described third embodiment that a cavity region including an inductor is disposed.

[Configuration of Cavity Region]

Figure 13:
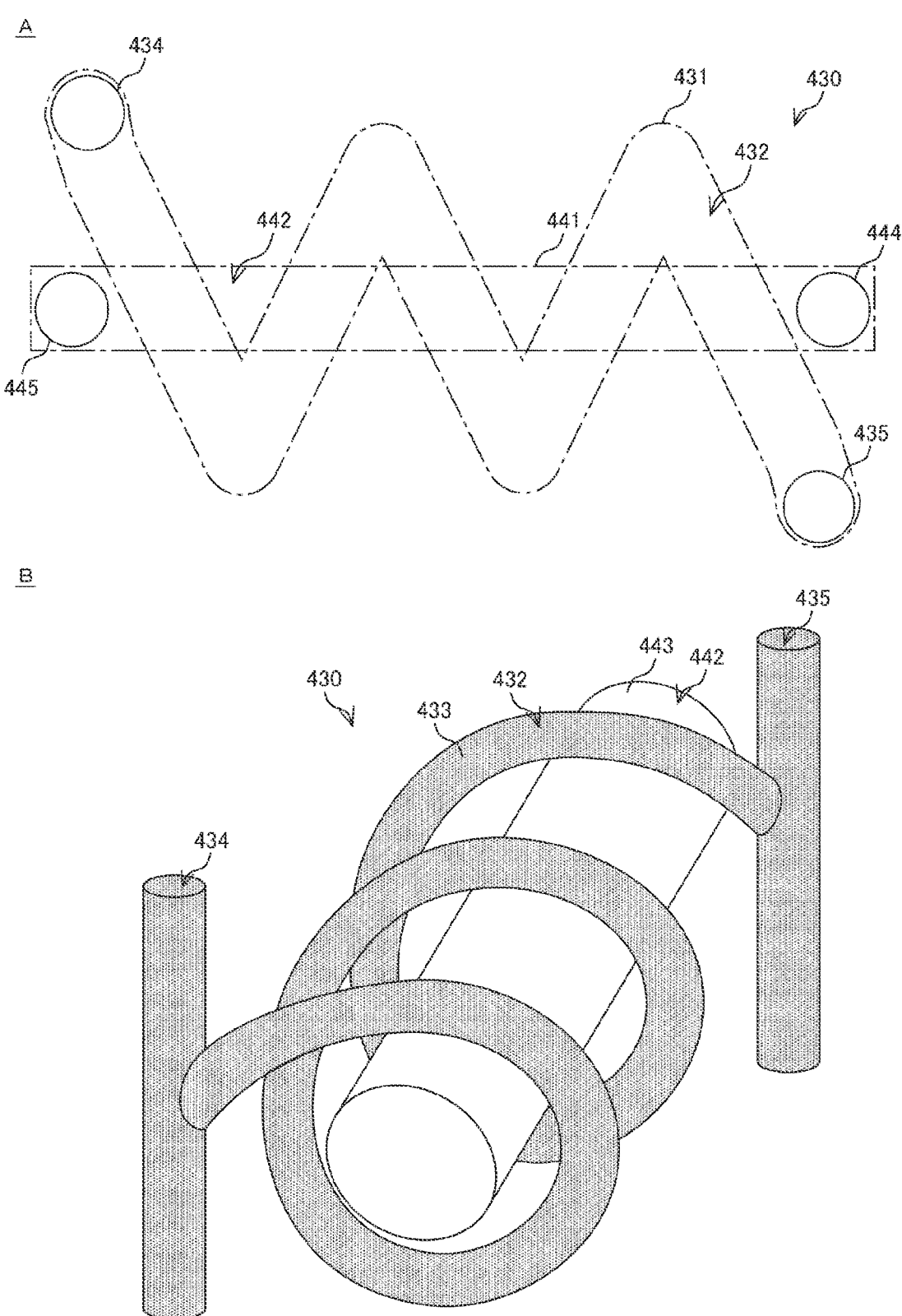
FIG. 13 is a diagram illustrating a configuration example of a cavity region according to a fourth embodiment of the present disclosure.

FIG. 13 is a diagram illustrating a configuration example of the cavity region according to the fourth embodiment of the present disclosure. The drawing is a diagram representing a configuration example of a cavity region 430. The cavity region 430 in the drawing is different from the cavity region 400 described in FIG. 12 in that cavities 432 and 442 are disposed instead of the cavities 422 and 424.

A in the drawing is a diagram representing a configuration example of the cavity region 430. The cavities 432 and 442 are disposed in the cavity region 430. The cavity 432 is a region divided by a wall surface 431 and is formed in a coil shape. Furthermore, the cavity 432 has holes 434 and 435 disposed therein. The cavity 442 is a region divided by a wall surface 441, formed in a cylindrical shape, and disposed in the center part of the cavity 432 having the coil shape. The cavity 442 has holes 444 and 445 disposed therein. As described later, a conductive member is disposed in the cavity 432, and a magnetic body is disposed in the cavity 442.

B in the drawing is a schematic perspective view representing a configuration example of the cavity region 430. The cavity 432 has a conductive member 433 disposed therein. This conductive member 433 is formed in a coil shape similarly to the cavity 432, and constitutes an inductor element. Similarly to the hole 427 in FIG. 12, the holes 434 and 435 are formed in a shape penetrating the sealing part 300, and has bottom parts disposed at positions adjacent to a wiring layer 202 of a substrate 200. The conductive member 433 can be formed by the method similar to that of the conductive member 423 described in FIG. 12.

The cavity 442 has a magnetic body 443 disposed therein. This magnetic body 443 constitutes a core part of the conductive member 433 constituting the inductor element. By disposing the core part of the magnetic body 443, the inductance of the conductive member 433 can be improved.

The magnetic body 443 can include a thermosetting resin in which ferrite particles are dispersed, and can be injected using the holes 444 and 445.

Note that the configuration of the cavity region 430 is not limited to this example. For example, the cavity 442 can be omitted.

Because the configuration of the semiconductor device 10 other than the above is similar to the configuration of the semiconductor device 10 described in the third embodiment of the present disclosure, the description thereof is omitted.

As described above, the semiconductor device 10 according to the fourth embodiment of the present disclosure can effectively utilize the region of the sealing part 300 by disposing, in the sealing part 300, the cavity region 430 having the conductive member 433 that constitute the inductor element.

5. Fifth Embodiment

In the semiconductor device 10 of the above-described third embodiment, the cavity region 420 having the capacitor element is disposed. On the other hand, a semiconductor device 10 according to a fourth embodiment of the present disclosure is different from the above-described third embodiment that a cavity region including an antenna is disposed.

[Configuration of Cavity Region]

Figure 14:
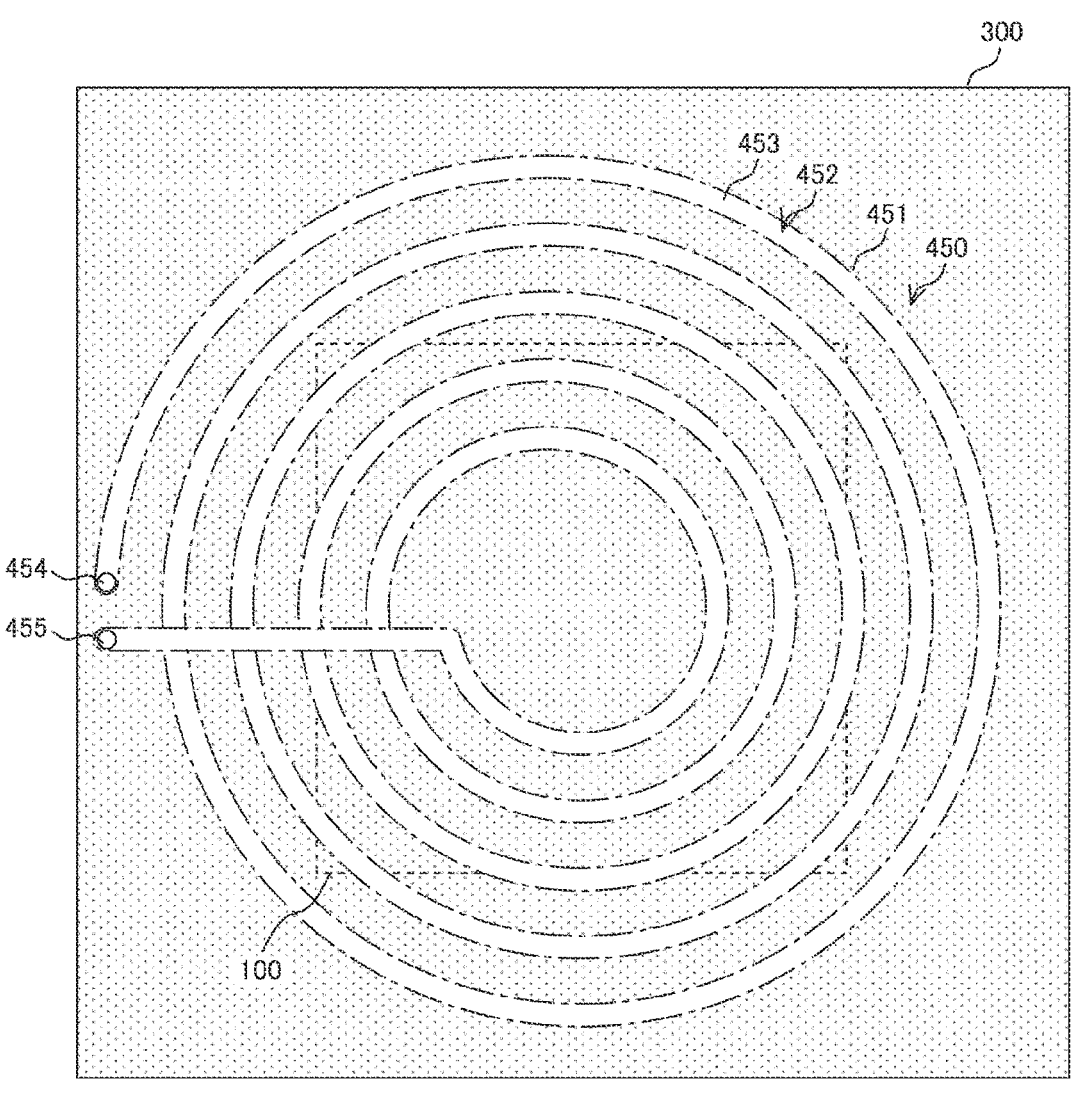
FIG. 14 is a diagram illustrating a configuration example of a cavity region according to a fifth embodiment of the present disclosure.

FIG. 14 is a diagram illustrating a configuration example of the cavity region according to the fifth embodiment of the present disclosure. Similarly to FIG. 2, the drawing is a diagram representing a configuration example of a sealing part 300. The sealing part is different from the sealing part 300 described in FIG. 2 in that a cavity region 450 is disposed instead of the cavity region 400.

A cavity 452 is disposed in the cavity region 450. As illustrated in the drawing, this cavity 452 is a cavity formed into a loop shape. The cavity 452 is a region divided by a wall surface 451 and has holes 454 and 455 disposed therein. Furthermore, the cavity 452 has a conductive member 453 disposed therein. This conductive member 453 is formed in a loop shape and constitutes an antenna element. Similarly to the hole 427 in FIG. 12, the holes 454 and 455 are formed in a shape penetrating the sealing part 300, and have bottom parts disposed at positions adjacent to a wiring layer 202 of a substrate 200. The conductive member 453 can be formed by the method similar to that of the conductive member 423 described in FIG. 12.

The cavity 452 in the drawing represents an example of being disposed in a region of the sealing part 300 on the upper surface side of a semiconductor chip 100. Similarly, the cavity region 450 in the drawing represents an example of being disposed in a region of the sealing part 300 on the upper surface side of the semiconductor chip 100.

Note that the configuration of the cavity region 450 is not limited to this example. For example, it is also possible to adopt a configuration in which the cavity 452 is formed in the sealing part 300 in a region adjacent to the side surface of the semiconductor chip 100, and the cavity region 450 is arranged in the region.

Because the configuration of the semiconductor device 10 other than the above is similar to the configuration of the semiconductor device 10 described in the third embodiment of the present disclosure, the description thereof is omitted.

As described above, the semiconductor device 10 according to the fifth embodiment of the present disclosure can effectively utilize the region of the sealing part 300 by disposing, in the sealing part 300, the cavity region 450 having the conductive member 453 that constitute the antenna element.

6. Sixth Embodiment

In the semiconductor device 10 of the above-described first embodiment, the semiconductor chip 100 is constituted using the FOWLP. On the other hand, a semiconductor device 10 according to a sixth embodiment of the present disclosure is different from the above-described first embodiment in that a semiconductor chip 100 is constituted using a general semiconductor package.

[Configuration of Semiconductor Device]

Figure 15:
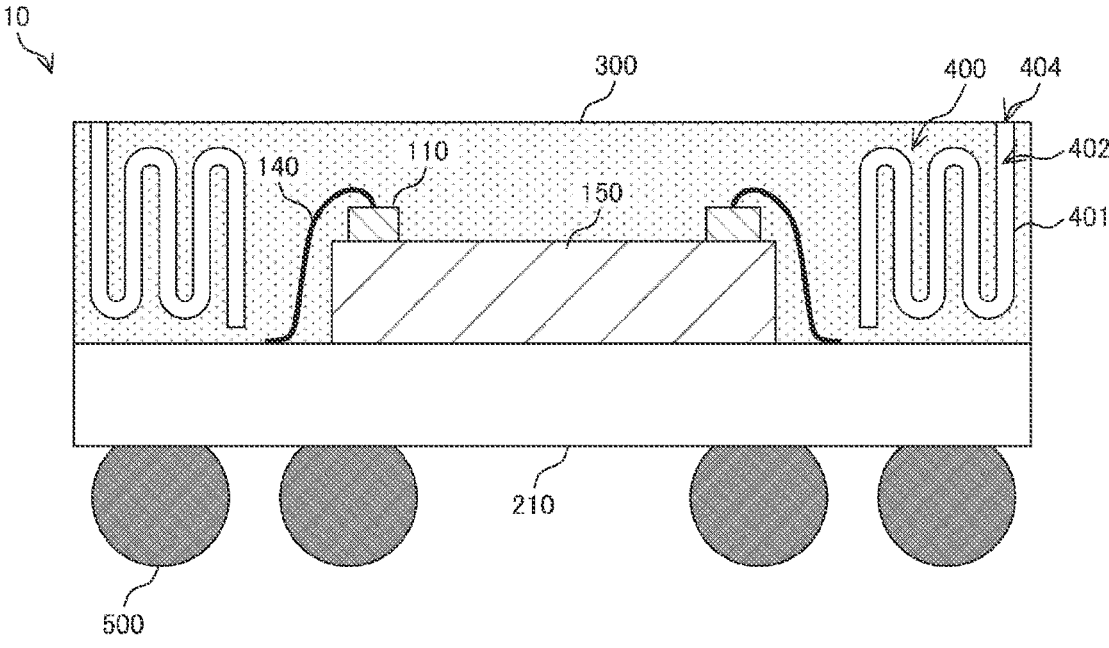
FIG. 15 is a diagram illustrating a configuration example of an imaging device according to a sixth embodiment of the present disclosure.

FIG. 15 is a diagram illustrating a configuration example of the semiconductor device according to the sixth embodiment of the present disclosure. Similarly to FIG. 3, the drawing is a diagram representing a configuration example of the semiconductor device 10. The semiconductor device is different from the semiconductor device 10 described in FIG. 3 in that a semiconductor chip 150 and a substrate 210 are disposed instead of the semiconductor chip 100 and the substrate 200, and the semiconductor chip 150 is connected by wire bonding.

The semiconductor chip 150 in the drawing is a semiconductor element in which a pad 110 is disposed on the upper surface side. This semiconductor chip 150 is connected to the substrate 210 by wire bonding using a bonding wire 140.

As described above, the substrate 210 is a substrate on the surface of which the semiconductor chip 150 is mounted. The semiconductor chip 150 is bonded to the substrate 210 with an adhesive, for example. Thereafter, the pad 110 of the semiconductor chip 150 and a pad (not illustrated) of the substrate 210 are connected to each other by a bonding wire 140 to perform the mounting. Note that the description of the wiring layer and the like of the substrate 210 is omitted.

A sealing part 300 in the drawing is disposed on the upper surface and the side surface of the semiconductor chip 150 after wire bonding. At that time, a cavity region 400 having a cavity 402 is disposed.

Because the configuration of the semiconductor device 10 other than the above is similar to the configuration of the semiconductor device 10 described in the first embodiment of the present disclosure, the description thereof is omitted.

As described above, the semiconductor device 10 according to the sixth embodiment of the present disclosure can effectively utilize the region of the sealing part 300 by disposing, in the sealing part 300, the cavity region 400 in a case where the semiconductor device is configured by using the semiconductor package other than the FOWLP.

7. Seventh Embodiment

An example in which the semiconductor device 10 of the above-described embodiment is applied to an imaging device is described.

[Configuration of Imaging Device]

Figure 16:
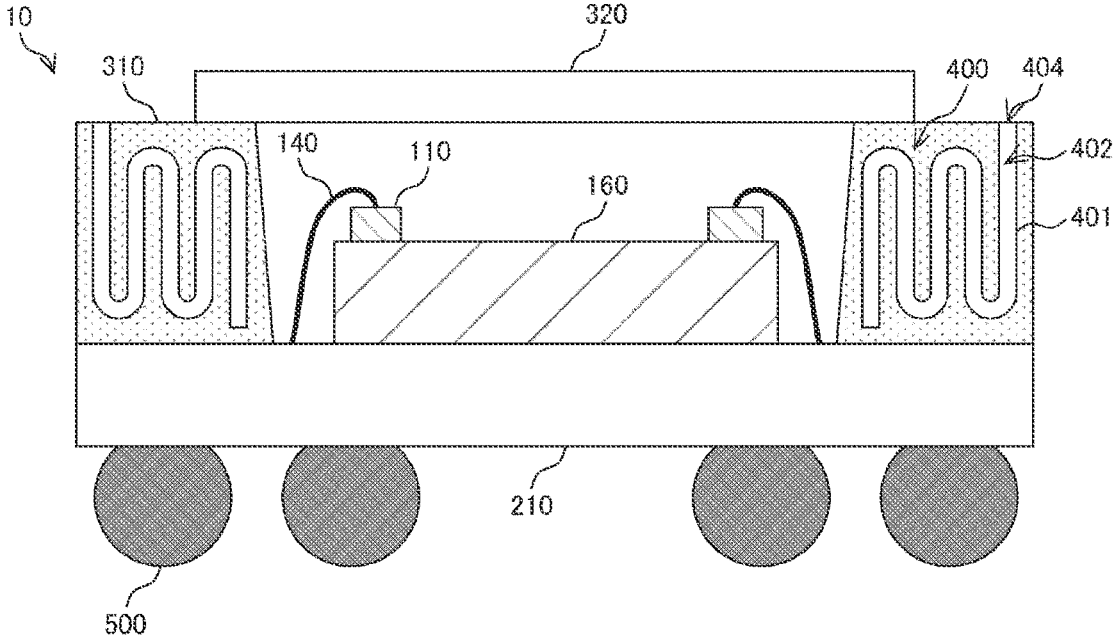
FIG. 16 is a diagram illustrating a configuration example of an imaging device according to a seventh embodiment of the present disclosure.

FIG. 16 is a diagram illustrating a configuration example of the imaging device according to a seventh embodiment of the present disclosure. The drawing represents an example in which a semiconductor device 10 is configured as an imaging device. The semiconductor device 10 in the drawing includes an imaging element 160, a sealing part 310, and a lid part 320 in addition to a substrate 210, a cavity region 400, and a connecting part 500.

The imaging element 160 is a semiconductor element formed in a shape of a semiconductor chip, and is a semiconductor element that images a subject. This imaging element 160 includes a plurality of pixels in each of which a photoelectric conversion unit that receives incident light is disposed. The photoelectric conversion unit performs photoelectric conversion of the received incident light and generates an electric charge according to the incident light. On the basis of this generated electric charge, an image signal is generated and output by a pixel circuit disposed for each pixel. As a result, the imaging element 160 performs imaging of the subject. A plurality of pixels is arranged in a two-dimensional lattice pattern on the upper surface of the imaging element 160, and is irradiated with the incident light. Furthermore, a pad 110 described in FIG. 15 is arranged at an end part of the upper surface of the imaging element 160, and is connected to a substrate 210 by a bonding wire 140. Note that the photoelectric conversion unit is an example of a light receiving element described in the claims.

The sealing part 310 in the drawing is formed in a shape surrounding a side surface of the imaging element 160. The lid part 320 is disposed on the upper surface of this sealing part 310. The lid part 320 includes a transparent member such as glass, and seals the imaging element 160 together with the sealing part 310. Also in the sealing part 310, similarly to the sealing part 300 in FIG. 15, a cavity region 400 having a cavity 402 is disposed.

Because the configuration of the semiconductor device 10 other than the above is similar to the configuration of the semiconductor device 10 described in the first embodiment of the present disclosure, the description thereof is omitted.

As described above, the semiconductor device 10 according to the seventh embodiment of the present disclosure can effectively utilize the region of the sealing part 310 by disposing the cavity region 400 in the sealing part 310 having a shape surrounding the side surface of the imaging element 160.

8. Eighth Embodiment

In the semiconductor device 10 of the above-described seventh embodiment, the lid part 320 is disposed on the upper surface of the imaging element 160. On the other hand, a semiconductor device 10 according to an eighth embodiment of the present disclosure is different from the above-described seventh embodiment in that a lens that forms an image of a subject on an imaging element 160 is disposed.

[Configuration of Imaging Device]

Figure 17:
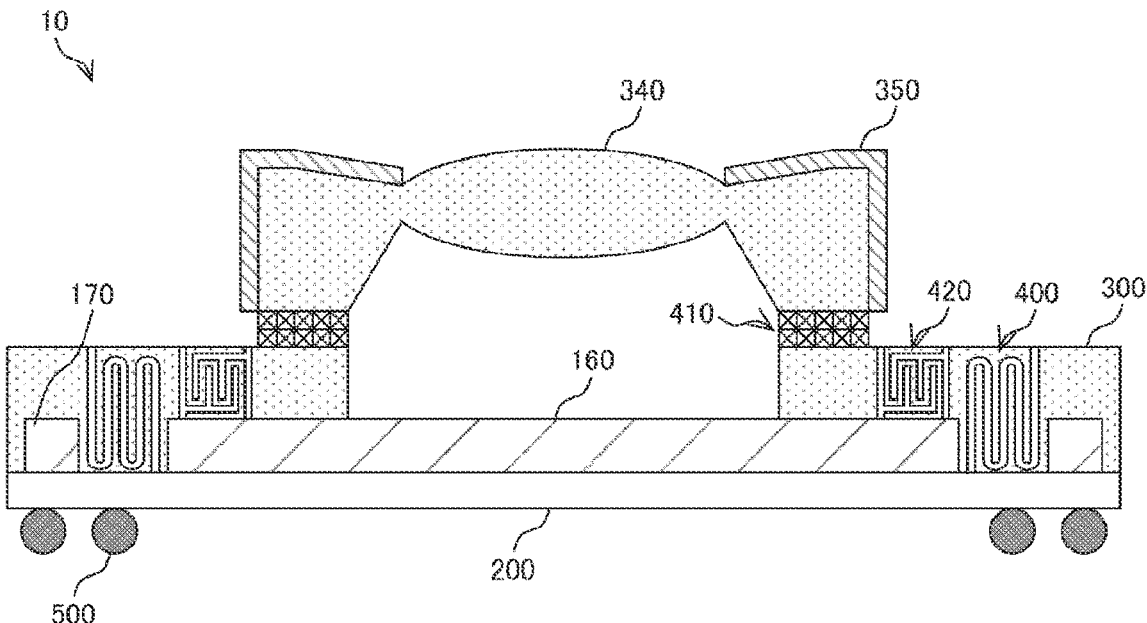
FIG. 17 is a diagram illustrating a configuration example of an imaging device according to an eighth embodiment of the present disclosure.

FIG. 17 is a diagram illustrating a configuration example of an imaging device according to the eighth embodiment of the present disclosure. Similarly to FIG. 16, the drawing is a diagram representing a configuration example of the semiconductor device 10 that constitutes the imaging device. The semiconductor device is different from the semiconductor device 10 described in FIG. 16 in that a lens 340 is disposed in a sealing part 300. Furthermore, in the semiconductor device 10 in the drawing, a light shielding film 350 and a semiconductor chip 170 are further disposed.

The lens 340 is a lens that forms the image of the subject on a pixel disposed on the upper surface of the imaging element 160. This lens 340 is formed in the sealing part 300 on the upper surface side of the imaging element 160 and formed in a shape covering the upper surface of the imaging element 160. This lens 340 can be formed by the CLIP manufacturing method.

The light shielding film 350 is a film that shields incident light. This light shielding film 350 is disposed in the periphery of the lens 340 and shields the incident light incident on the imaging element 160 from a region other than the lens 340.

The lens 340, the sealing part 300 in the periphery of the lens 340, and the light shielding film 350 constitute a lens unit. By forming this lens unit integrally with the sealing part 300 of the imaging element 160 and disposing the lens unit in the semiconductor device 10, the semiconductor device 10 can be downsized. Furthermore, by forming a portion of the lens unit excluding the light shielding film 350 simultaneously with the sealing part 300, the manufacturing process of the lens unit can be simplified.

On a substrate 200 in the drawing, the semiconductor chip 170 other than the imaging element 160 is further disposed. For example, to this semiconductor chip 170, for example, an image processing chip that processes an image signal generated by the imaging element 160, a power supply chip that supplies power to the imaging element 160, or a communication chip that communicates with the outside can be applied. The sealing part 300 in the drawing further seals this semiconductor chip 170.

Note that the sealing part 300 in the drawing represents an example in which the cavity region 400 described in FIG. 3, the cavity region 410 described in FIG. 7, and the cavity region 420 described in FIG. 12 are disposed. By disposing the above cavity regions in the sealing part 300, the region of the sealing part 300 can be effectively utilized. Note that, as illustrated in the drawing, the cavity region 410 is preferably disposed between the above-described lens unit and the region of the sealing part 300 adjacent to the imaging element 160. This is because by configuring the cavity region 410 to the negative thermal expansion coefficient, a shift of a focal position of the lens 340 due to the temperature change of the sealing part 300 can be compensated.

Note that the configuration of the semiconductor device 10 is not limited to this example. For example, the cavity region 430 described in FIG. 13 and the cavity region 450 described in FIG. 14 can also be disposed in the semiconductor device.

Because the configuration of the semiconductor device 10 other than the above is similar to the configuration of the semiconductor device 10 described in the first embodiment of the present disclosure, the description thereof is omitted.

As described above, the semiconductor device 10 according to the eighth embodiment of the present disclosure can downsize the semiconductor device 10 by disposing the lens 340 in the sealing part 300.

9. Ninth Embodiment

In the semiconductor device 10 of the above-described seventh embodiment, the sealing part 300 having a shape covering the side surface of the imaging element 160 is disposed. On the other hand, a semiconductor device 10 according to a ninth embodiment of the present disclosure is different from the above-described seventh embodiment in that a sealing part having a shape covering the upper surface of an imaging element 160 is disposed.

[Configuration of Imaging Device]

Figure 18:
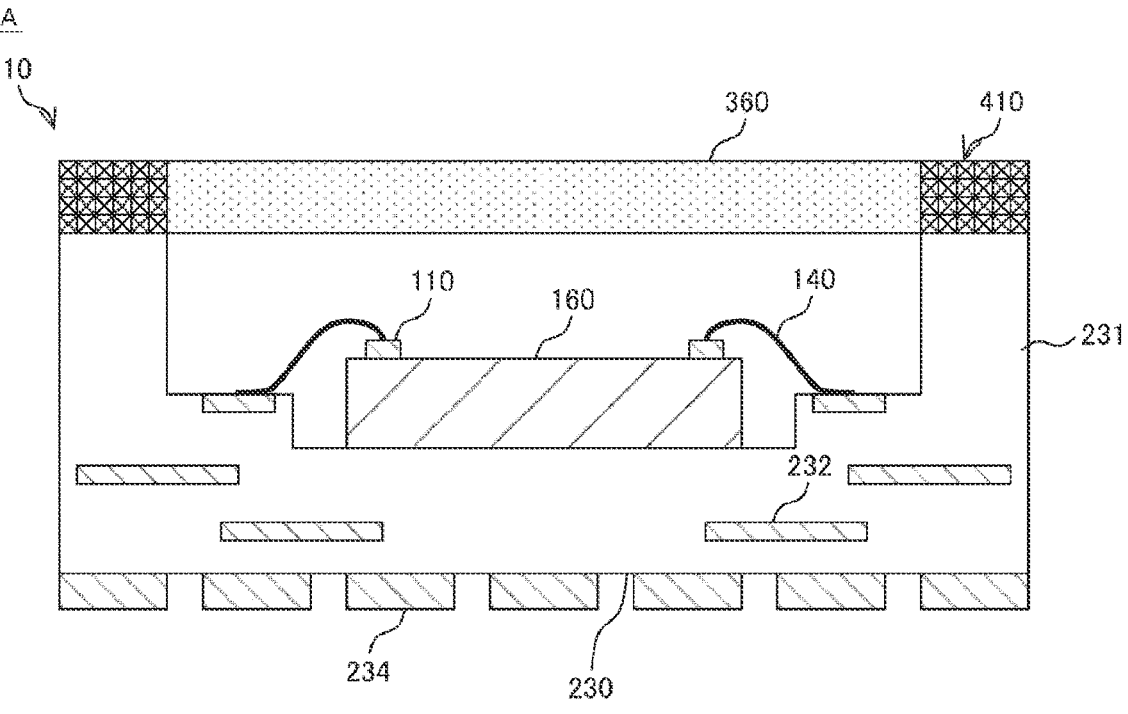
FIG. 18 is a diagram illustrating a configuration example of an imaging device according to a ninth embodiment of the present disclosure.
Figure 18:
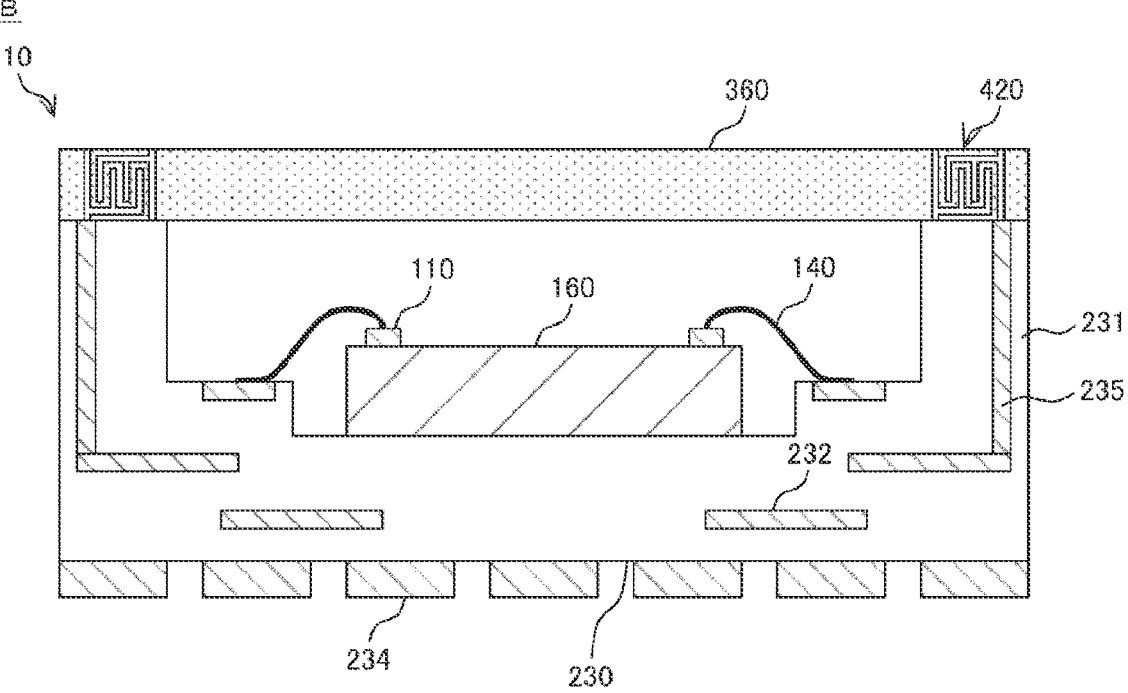

FIG. 18 is a diagram illustrating a configuration example of an imaging device according to the ninth embodiment of the present disclosure. Similarly to FIG. 16, the drawing is a diagram representing a configuration example of the semiconductor device 10. The semiconductor device is different from the semiconductor device 10 described in FIG. 16 in that a sealing part 360 and a substrate 230 are disposed instead of the sealing part 310, the lid part 320, and the substrate 210.

The substrate 230 is a substrate formed in a cavity shape. This substrate 230 includes an insulating layer 231 including ceramic or the like, and is a substrate on which the imaging element 160 is disposed at the bottom of the cavity shape. A wiring layer 232 is disposed on the substrate 230. Furthermore, on the bottom surface of the substrate 230, a pad 234 is disposed. The imaging element 160 is connected to the wiring layer 232 of the substrate 230 by a bonding wire 140.

The sealing part 360 is formed in a shape that covers the upper surface of the imaging element 160, and seals the imaging element 160. This sealing part 360 is disposed adjacent to a wall part of the substrate 230 having the cavity shape. Similarly to the sealing part 300, the sealing part 360 can include a transparent photocurable resin. Cavity regions 400, 410, 420, 430 and 450 can be disposed in this sealing part 360. A in the drawing is a view representing an example in which the cavity region 410 is disposed in the sealing part 360, and B in the drawing is a view representing an example in which the cavity region 420 is disposed in the sealing part 360. In B in the drawing, a via plug 235 is disposed in a wall part of the substrate 230. This via plug 235 connects the element of the cavity region 420 and the wiring layer 232.

Because the configuration of the semiconductor device 10 other than the above is similar to the configuration of the semiconductor device 10 described in the seventh embodiment of the present disclosure, the description thereof is omitted.

As described above, the semiconductor device 10 according to the ninth embodiment of the present disclosure can effectively utilize the region of the sealing part 360 by disposing the cavity region 410 or the like in the sealing part 360.

10. Tenth Embodiment

An example in which the semiconductor device 10 of the above-described embodiment is applied to a light source device is described. In the semiconductor device 10 of the above-described ninth embodiment, the imaging element 160 is sealed by the sealing part 360. On the other hand, a semiconductor device 10 according to a tenth embodiment of the present disclosure is different from the above-described ninth embodiment in that a light emitting element is sealed by a sealing part.

[Configuration of Light Source Device]

Figure 19:
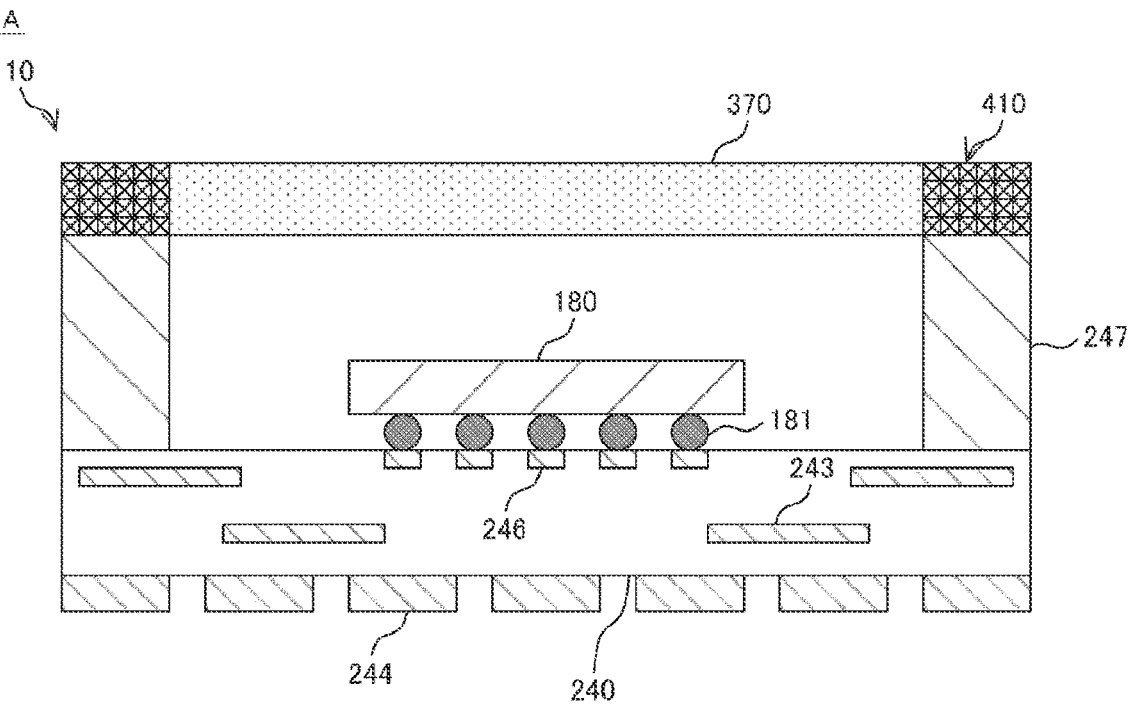
FIG. 19 is a diagram illustrating a configuration example of a light source device according to a tenth embodiment of the present disclosure.
Figure 19:
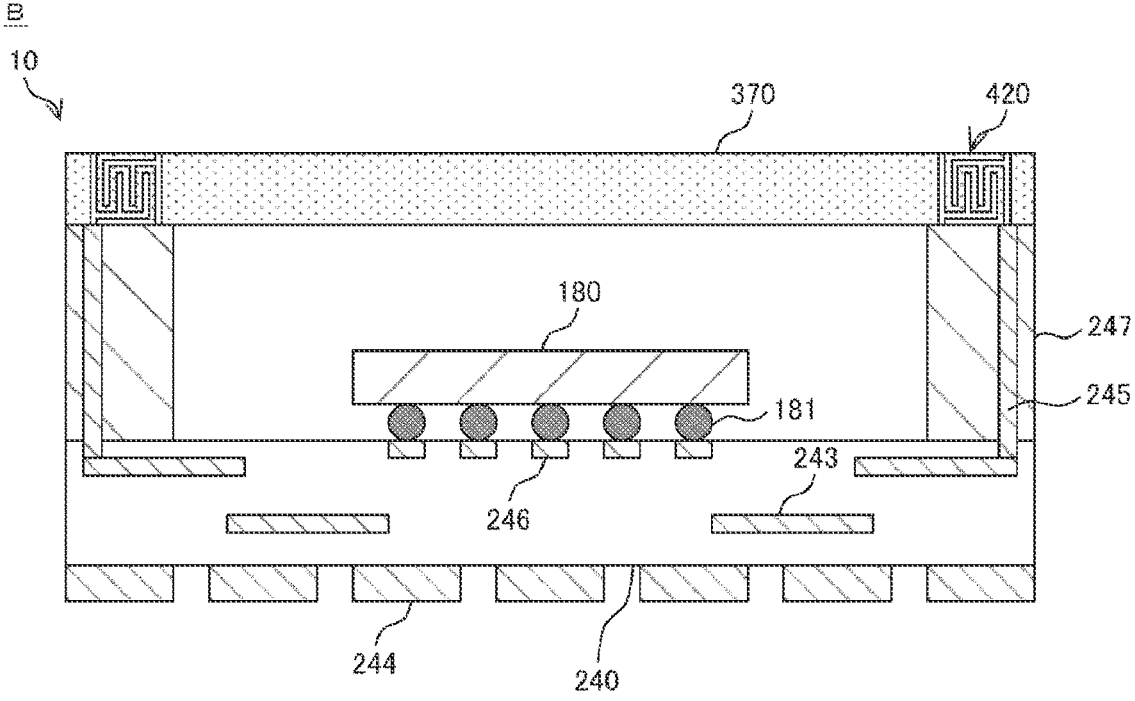

FIG. 19 is a diagram illustrating a configuration example of a light source device according to a tenth embodiment of the present disclosure. The semiconductor device 10 in the drawing is configured to emit a laser beam. The semiconductor device 10 includes a light emitting element 180, a substrate 240, a wall part 247, and a sealing part 370.

The light emitting element 180 is an element that outputs the laser beam. This light emitting element 180 is a light emitting element configured as a semiconductor chip on which a laser diode is disposed. The laser beam is output from the upper surface of the light emitting element 180. A terminal 181 is disposed at the bottom part of the light emitting element 180.

As described above, the substrate 240 is a substrate on the surface of which the light emitting element 180 is mounted. On this substrate 240, a pad 246 to which the terminal 181 of the light emitting element 180 is connected, a wiring layer 243, and a substrate pad 244 are disposed.

The wall part 247 is formed in a shape surrounding the side surface of the light emitting element 180, and forms a cavity together with the substrate 240 to house the light emitting element 180. The wall part 247 includes a member that does not transmit the laser beam of the light emitting element 180.

The sealing part 370 is formed in a shape that covers the upper surface of the light emitting element 180, and seals the light emitting element 180. Furthermore, this sealing part 370 can be used as a diffusion plate that converts the laser beam output from the light emitting element 180 into diffused light. The sealing part 370 is disposed adjacent to the wall part 247. Similarly to the sealing part 360, cavity regions 400, 410, 420, 430 and 450 can be disposed in the sealing part 370. A in the drawing is a view representing an example in which the cavity region 410 is disposed in the sealing part 370, and B in the drawing is a view representing an example in which the cavity region 420 is disposed in the sealing part 370. In B in the drawing, a via plug 245 is disposed in the wall part 247. This via plug 245 connects the element of the cavity region 420 and the wiring layer 243.

Because the configuration of the semiconductor device 10 other than the above is similar to the configuration of the semiconductor device 10 described in the ninth embodiment of the present disclosure, the description thereof is omitted.

As described above, the semiconductor device 10 according to the tenth embodiment of the present disclosure can effectively utilize the region of the sealing part 370 by disposing the cavity region 410 or the like in the sealing part 370.

Note that the configuration of the cavity region of the third embodiment can be combined with the configurations of other embodiments. Specifically, the cavity region 420 in FIG. 12 can be applied to the sealing part 300 in FIG. 15 and the sealing part 310 in FIG. 16.

Note that the configuration of the cavity region of the fourth embodiment can be combined with the configurations of other embodiments. Specifically, the cavity region 430 in FIG. 13 can be applied to the sealing part 300 in FIG. 15 and the sealing part 310 in FIG. 16.

Note that the configuration of the cavity region of the fifth embodiment can be combined with the configurations of other embodiments. Specifically, the cavity region 450 in FIG. 14 can be applied to the sealing part 300 in FIG. 15 and the sealing part 310 in FIG. 16.

Finally, the description of each of the above-described embodiments is an example of the present disclosure, and the present disclosure is not limited to the above-described embodiments. For this reason, it is needless to say that various modifications can be made according to the design and the like without departing from the technical idea according to the present disclosure even in those other than the above-described embodiments.

Furthermore, the effects described in the present description are merely examples and are not limited. Furthermore, there may be other effects.

Furthermore, the drawings in the above-described embodiments are schematic, and dimensional ratios and the like of the respective parts does not necessarily coincide with actual ones. Furthermore, it is needless to say that the drawings include portions having different dimensional relationships and ratios from each other.

Note that the present technology can also take the following configurations.

(1) A semiconductor device including:
a semiconductor element;

a substrate disposed adjacent to a bottom surface of the semiconductor element;

a sealing part formed in a shape that covers an upper surface that is a surface opposing to the bottom surface of the semiconductor element, and seals the semiconductor element; and a cavity region that is a region disposed in the sealing part and formed with a cavity.

(2) The semiconductor device according to (1), in which, in the cavity region, the cavity includes a wall surface that is constituted of the sealing part including resin.

(3) The semiconductor device according to (2), in which, in the cavity region, the resin that constitutes the wall surface of the cavity includes a photocurable resin.

(4) The semiconductor device according to (3), in which, in the cavity region, the wall surface of the cavity is formed by curing the resin that is uncured, and the cavity is formed by removing the resin that is uncured.

(5) The semiconductor device according to any one of (1) to (4), in which the cavity region is constituted by alternately disposing the cavity and the sealing part.

(6) The semiconductor device according to (5), in which the cavity region is constituted by disposing the cavity whose cross-section has a meander structure.

(7) The semiconductor device according to any one of (1) to (3), in which the cavity region includes the sealing part formed in a lattice shape.

(8) The semiconductor device according to (7), in which the cavity region includes the sealing part having the lattice shape of a different thermal expansion coefficient.

(9) The semiconductor device according to (1), in which the cavity region includes an element including a conductive member disposed in the cavity.

(10) The semiconductor device according to (9), in which the cavity region includes the element including the conductive member disposed in two of the cavities disposed opposed to each other.

(11) The semiconductor device according to (9), in which the cavity region includes the element including the conductive member disposed in the cavity having a coil shape.

(12) The semiconductor device according to (11), in which the cavity region includes the element including a core part including a magnetic material disposed in the cavity formed in a center part of the cavity having the coil shape.

(13) The semiconductor device according to (9), in which the cavity region includes the element including the conductive member disposed in the cavity having a loop shape.

(14) The semiconductor device according to any one of (1) to (13), in which the semiconductor element is disposed with a terminal that transmits a signal to the bottom surface, the substrate includes wiring connected to the terminal and extending in a region outside the semiconductor element, and the sealing part is disposed adjacent to a side surface that is a surface adjacent to the bottom surface of the semiconductor element.

(15) The semiconductor device according to any one of (1) to (14), in which the sealing part includes a wall part having a shape surrounding the semiconductor element and a lid part having a shape covering an upper surface of the semiconductor element.

(16) The semiconductor device according to (15), in which the cavity region is disposed in the wall part.

(17) The semiconductor device according to (15), in which the cavity region is disposed in the lid part.

(18) The semiconductor device according to (17), in which the sealing part includes the lid part that is a transparent member.

(19) The semiconductor device according to any one of (1) to (18), in which the semiconductor element includes a light receiving element that receives incident light.

(20) The semiconductor device according to (19), in which the sealing part includes a lens part including a transparent member and configured to condense the incident light on the light receiving element.

(21) The semiconductor device according to any one of (1) to (18), in which the semiconductor element includes a light emitting element.

(22) The semiconductor device according to (21), in which the sealing part diffuses light of the light emitting element.

(23) A manufacturing method of a semiconductor device, the method including:

a sealing step of shaping a sealing part that seals a semiconductor element whose bottom surface is disposed adjacent to a substrate into a shape that covers an upper surface opposed to the bottom surface of the semiconductor element; and a cavity region disposing step of disposing a cavity region that is a region in the sealing part where a cavity is formed.

REFERENCE SIGNS LIST

10 Semiconductor device
100, 150, 170 Semiconductor chip
160 Imaging element
180 Light emitting element
200, 210, 220, 230, 240 Substrate
247 Wall part
300, 310, 360, 370 Sealing part
320 Lid part
340 Lens
350 Light shielding film
400, 410, 420, 430, 450 Cavity region
401, 421, 424, 431, 451 Wall surface
402, 419, 422, 425, 432, 442, 452 Cavity
411, 411a, 411b Unit lattice
412 Coupling part
423, 426, 433, 453 Conductive member
443 Magnetic body

What is claimed is:

1. A semiconductor device comprising:

a semiconductor element;

a substrate disposed adjacent to a bottom surface of the semiconductor element;

a sealing part formed in a shape that covers an upper surface that is a surface opposing to the bottom surface of the semiconductor element, and seals the semiconductor element; and a cavity region that is a region disposed in the sealing part and formed with a cavity, wherein the cavity region includes an open end, wherein the cavity region includes a closed end, and wherein the cavity region includes a plurality of folds.

2. The semiconductor device according to claim 1, wherein, in the cavity region, the cavity includes a wall surface that is constituted of the sealing part including resin.

3. The semiconductor device according to claim 2, wherein, in the cavity region, the resin that constitutes the wall surface of the cavity includes a photocurable resin.

4. The semiconductor device according to claim 3, wherein, in the cavity region, the wall surface of the cavity is formed by curing the resin that is uncured, and the cavity is formed by removing the resin that is uncured.

5. The semiconductor device according to claim 1, wherein the cavity region is constituted by alternately disposing the cavity and the sealing part.

6. The semiconductor device according to claim 5, wherein the cavity region is constituted by disposing the cavity whose cross-section has a meander structure.

7. The semiconductor device according to claim 1, wherein the cavity region includes the sealing part formed in a lattice shape.

8. The semiconductor device according to claim 7, wherein the cavity region includes the sealing part having the lattice shape of a different thermal expansion coefficient.

9. The semiconductor device according to claim 1, wherein the cavity region includes an element including a conductive member disposed in the cavity.

10. The semiconductor device according to claim 9, wherein the cavity region includes the element including the conductive member disposed in two of the cavities disposed opposed to each other.

11. The semiconductor device according to claim 9, wherein the cavity region includes the element including the conductive member disposed in the cavity having a coil shape.

12. A semiconductor device comprising:
a semiconductor element;
a substrate disposed adjacent to a bottom surface of the semiconductor element;
a sealing part formed in a shape that covers an upper surface that is a surface opposing to the bottom surface of the semiconductor element, and seals the semiconductor element; and
a cavity region that is a region disposed in the sealing part and formed with a cavity,
wherein the cavity region includes an element including a conductive member disposed in the cavity,
wherein the cavity region includes the element including the conductive member disposed in the cavity having a coil shape, and
wherein the cavity region includes the element including a core part including a magnetic material disposed in the cavity formed in a center part of the cavity having the coil shape.

13. The semiconductor device according to claim 9, wherein the cavity region includes the element including the conductive member disposed in the cavity having a loop shape.

14. The semiconductor device according to claim 1, wherein
the semiconductor element is disposed with a terminal that transmits a signal to the bottom surface,
the substrate includes wiring connected to the terminal and extending in a region outside the semiconductor element, and
the sealing part is disposed adjacent to a side surface that is a surface adjacent to the bottom surface of the semiconductor element.

15. The semiconductor device according to claim 1, wherein the sealing part includes a wall part having a shape surrounding the semiconductor element and a lid part having a shape covering an upper surface of the semiconductor element.

16. The semiconductor device according to claim 15, wherein the cavity region is disposed in the wall part.

17. The semiconductor device according to claim 15, wherein the cavity region is disposed in the lid part.

18. The semiconductor device according to claim 17, wherein the sealing part includes the lid part that is a transparent member.

19. The semiconductor device according to claim 1, wherein the semiconductor element includes a light receiving element that receives incident light.

20. A semiconductor device comprising:
a semiconductor element;
a substrate disposed adjacent to a bottom surface of the semiconductor element;
a sealing part formed in a shape that covers an upper surface that is a surface opposing to the bottom surface of the semiconductor element, and seals the semiconductor element; and
a cavity region that is a region disposed in the sealing part and formed with a cavity,
wherein the semiconductor element includes a light receiving element that receives incident light, and
wherein the sealing part includes a lens part including a transparent member and configured to condense the incident light on the light receiving element.

21. The semiconductor device according to claim 1, wherein the semiconductor element includes a light emitting element.

22. The semiconductor device according to claim 21, wherein the sealing part diffuses light of the light emitting element.

23. The semiconductor device according to claim 1, wherein the open end of the cavity region is in a surface of the sealing part on a side of the sealing part that is opposite to the bottom surface of the semiconductor element.

* * * * *